US009799272B2

(12) United States Patent
Zhang et al.

(10) Patent No.: US 9,799,272 B2
(45) Date of Patent: Oct. 24, 2017

(54) SHIFT REGISTER, GATE DRIVING CIRCUIT AND RELEVANT DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Yi Zhang, Beijing (CN); Yu Feng, Beijing (CN); Jianchao Zhu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/320,613

(22) PCT Filed: Feb. 5, 2016

(86) PCT No.: PCT/CN2016/073624
§ 371 (c)(1),
(2) Date: Dec. 20, 2016

(87) PCT Pub. No.: WO2017/031955
PCT Pub. Date: Mar. 2, 2017

(65) Prior Publication Data
US 2017/0200418 A1    Jul. 13, 2017

(30) Foreign Application Priority Data
Aug. 27, 2015    (CN) .......................... 2015 1 0536801

(51) Int. Cl.
G09G 3/3266 (2016.01)
G09G 3/325 (2016.01)
G11C 19/28 (2006.01)

(52) U.S. Cl.
CPC .......... *G09G 3/3266* (2013.01); *G09G 3/325* (2013.01); *G11C 19/28* (2013.01); *G09G 2300/0809* (2013.01); *G09G 2310/0286* (2013.01)

(58) Field of Classification Search
CPC ................. G09G 3/3266; G09G 3/325; G09G 2300/0809; G09G 2310/0286; G11C 19/28
See application file for complete search history.

(56) References Cited

U.S. PATENT DOCUMENTS

| 8,948,336 | B2* | 2/2015 | Qi | .......................... G11C 19/28 377/64 |
| 9,019,192 | B2* | 4/2015 | Ma | ........................ G09G 3/3611 345/100 |
| 2003/0128180 | A1* | 7/2003 | Kim | ..................... G09G 3/3677 345/100 |

FOREIGN PATENT DOCUMENTS

| CN | 1298169 A | 6/2001 |
| CN | 1815545 A | 8/2006 |

(Continued)

OTHER PUBLICATIONS

International Search Report and Written Opinion dated May 24, 2016; PCT/CN2016/073624.

*Primary Examiner* — Matthew Sim
(74) *Attorney, Agent, or Firm* — Ladas & Parry LLP

(57) ABSTRACT

There are provided a shift register, a gate driving circuit and a relevant display device, comprising a first node controlling module (1), a second node controlling module (2), a third node controlling module (3), a first outputting module (4)

(Continued)

and a second outputting module (5). The first node controlling module (1) adjust a potential of a first node (A), the second node controlling module (2) adjust a potential of a second node (B), the third node controlling module (3) adjust a potential of a third node (C), the first outputting module (4) adjust a potential of a driving signal output terminal (Output), and the second outputting module (5) adjusts the potential of the driving signal output terminal (Output). Through mutual coordination of the five modules, the shift register could control a time length of a scanning signal outputted by the driving signal output terminal (Output) by only changing a time length of an input signal (Input), without changing clock signals (CK,CB) and changing the circuit and process, so that difficulty of the gate driving circuit and complexity of process could be reduced, thereby the cost is reduced.

19 Claims, 10 Drawing Sheets

(56) References Cited

FOREIGN PATENT DOCUMENTS

| | | |
|---|---|---|
| CN | 104809978 A | 7/2015 |
| CN | 104835450 A | 8/2015 |
| CN | 105185287 A | 12/2015 |
| KR | 101510583 B1 | 4/2015 |

\* cited by examiner

SHIFT REGISTER, GATE DRIVING CIRCUIT AND RELEVANT DISPLAY DEVICE

TECHNICAL FIELD

The present disclosure relates to a shift register, a gate driving circuit and a relevant display device.

BACKGROUND

As display technique develops rapidly, a display emerges a trend towards development of high integration and low cost. Herein, Gate Driver on Array (GOA) technique integrates a thin film transistor (TFT) gate switching circuit on an array substrate of a display panel to form scanning drive of the display panel, so that wiring space of bonding region and fan-out region of a gate integrated circuit (IC) could be saved. It could not only reduce products' cost on material and manufacturing process, but also enable the display panel to realize an artistic design with symmetrical on both sides and narrow frame. Furthermore, such integration process could also spare bonding process in a direction of gate scanning line, so as to raise productivity and yield rate.

The GOA circuit is generally composed of multiple shift registers connected in cascades. A driving signal output terminal of each stage of shift register is corresponding to one gate line respectively, and is used to arrange respective gate lines along a scanning direction sequentially. For the existing GOA circuit, scanning time length for each row of gate lines is generally fixed. Therefore, the existing GOA circuit is not suitable for use in some display devices that need to adjust the scanning time length of each row of gate lines according to actual situation.

At present, although adjusting of the scanning time length could be realized by using different clock control signals, it needs to use a plurality of clock controllers. Furthermore, for different scanning time lengths, cascading relationships of shift registers in the GOA circuit are also different, thereby resulting in that application of the existing GOA circuit into the display devices that need to adjust the scanning time length of gate lines according to actual situation becomes more difficult and manufacturing cost increases, such that these display devices are not competitive.

SUMMARY

Given that, there are provided in embodiments of the present disclosure a shift register, a gate driving circuit and a relevant display device.

Therefore, there is provided in an embodiment of the present disclosure a shift register, comprising: a first node controlling module, a second node controlling module, a third node controlling module, a first outputting module and a second outputting module; wherein a first input terminal of the first node controlling module is used to receive an input signal, a second input terminal thereof is used to receive a first clock signal, a third input terminal thereof is used to receive a second clock signal, a fourth input terminal thereof is used to receive a first direct current signal, a fifth input terminal thereof is connected to a second node, and an output terminal thereof is connected to a first node; the first node controlling module is configured to provide the input signal to the first node when a potential of the first clock signal is a first potential, provide the first direct current signal to the first node when both a potential of the second clock signal and a potential of the second node are the first potential, and maintain a voltage difference between the third input terminal and the first node to a voltage difference of a previous period of time when the first node is in a floating status;

a first input terminal of the second node controlling module is used to receive a second direct current signal, a second input terminal thereof is used to receive a first clock signal, a third input terminal thereof is used to receive a second clock signal, a fourth input terminal thereof is connected to the first node, and an output terminal thereof is connected to the second node; the second node controlling module is configured to provide the second direct current signal to the second node when a potential of the first clock signal is a first potential, provide the first clock signal to the second node when a potential of the first node is the first potential, and maintain a voltage difference between the third input terminal and the second node to a voltage difference of the previous period of time when the second node is in a floating status;

a first input terminal of the third node controlling module is used to receive the second clock signal, a second input terminal thereof is used to receive the first direct current signal, a third input terminal thereof is used to receive the second direct current signal, a fourth input terminal thereof is connected to the first node, a fifth input terminal thereof is connected to the second node, and an output terminal thereof is connected to a third node; the third node controlling module is configured to provide the first direct current signal to the third node when the potential of the first node is the first potential, provide the second direct current signal to the third node when both the potential of the second clock signal and the potential of the second node are the first potential, and maintain a voltage difference between the second input terminal and the third node to a voltage difference of the previous period of time when the third node is in a floating status;

a first input terminal of the first outputting module is used to receive the second direct current signal, a second input terminal thereof is connected to the first node, and an output terminal thereof is connected to a driving signal output terminal of the shift register; the first outputting module is configured to provide the second direct current signal to the driving signal output terminal when the potential of the first node is the first potential.

a first input terminal of the second output module is used to receive the first direct current signal, a second input terminal thereof is connected to the third node, and an output terminal thereof is connected to the driving signal output terminal of the shift register; the second output module is configured to provide the first direct current signal to the driving signal output terminal when the potential of the third node is the first potential;

when a valid pulse signal of the input signal is a high potential, the first potential is a low potential, the potential of the first direct current signal is a high potential, and the potential of the second direct current signal is a low potential; or when a valid pulse signal of the input signal is a low potential, the first potential is a high potential, the potential of the first direct current signal is a low potential, and the potential of the second direct current signal is a high potential.

In a possible implementation, in the shift register provided in the embodiment of the present disclosure, the first node controlling module comprises: a first switch transistor, a second switch transistor, a third switch transistor, and a first capacitor; wherein a gate of the first switch transistor is used to receive the first clock signal, a source thereof is used to receive the input signal, and a drain thereof is connected to the first node;

a gate of the second switch transistor is connected to the second node, a source thereof is used to receive the first direct current signal, and a drain thereof is connected to a source of the third switch transistor;

a gate of the third switch transistor is used to receive the second clock signal, and a drain thereof is connected to the first node; and one terminal of the first capacitor is connected to the first node, and the other terminal thereof is used to receive the second clock signal.

In a possible implementation, in the shift register provided in the embodiment of the present disclosure, the second node controlling module comprises: a fourth switch transistor, a fifth switch transistor and a second capacitor; wherein, a gate of the fourth switch transistor is connected to the first node, a source thereof is used to receive the first clock signal, and a drain thereof is connected to the second node;

a gate of the fifth switch transistor is used to receive the first clock signal, a source thereof is used to receive the second direct current signal, and a drain thereof is connected to the second node; and one terminal of the second capacitor is connected to the second node, and the other terminal thereof is used to receive the second clock signal.

In a possible implementation, in the shift register provided in the embodiment of the present disclosure, the third node controlling module comprises: a sixth switch transistor, a seventh switch transistor, an eighth switch transistor and a third capacitor; wherein, a gate of the sixth switch transistor is connected to the second node, a source thereof is used to receive the second direct current signal, and a drain thereof is connected to a source of the seventh switch transistor;

a gate of the seventh switch transistor is used to receive the second clock signal; and a drain thereof is connected to the third node;

a gate of the eighth switch transistor is connected to the first node, a source thereof is used to receive the first direct current signal, and a drain thereof is connected to the third node; and one terminal of the third capacitor is connected to the third node, and the other terminal thereof is used to receive the first direct current signal.

In a possible implementation, in the shift register provided in the embodiment of the present disclosure, the first outputting module comprises: a ninth switch transistor; wherein.

a gate of the ninth switch transistor is connected to the first node, a source thereof is used to receive the second direct current signal, and a drain thereof is connected to the driving signal output terminal.

In a possible implementation, in the shift register provided in the embodiment of the present disclosure, the second outputting module comprises: a tenth switch transistor; wherein, a gate of the tenth switch transistor is connected to the third node, a source thereof is used to receive the first direct current signal, and a drain thereof is connected to the driving signal output terminal.

Further, in the shift register provided in the embodiment of the present disclosure, when a valid pulse signal of the input signal is a high potential, all of switch transistors are P type transistors;

When a valid pulse signal of the input signal is a low potential, all of switch transistors are N type transistors.

Further, in the shift register provided in the embodiment of the present disclosure, when the valid pulse signal of the input signal is a high potential, a rising edge of the input signal aligns with a falling edge of the first clock signal and a rising edge of the second clock signal, and a falling edge of the input signal aligns with a rising edge of the first clock signal. The first clock signal and the second clock signal have a same cycle and a same duty ratio, and the duty ratio is greater than 0.5; or, when the valid pulse signal of the input signal is a low potential, the falling edge of the input signal aligns with the rising edge of the first clock signal and the falling edge of the second clock signal, and the rising edge of the input signal aligns with the falling edge of the first clock signal. The first clock signal and the second clock signal have a same cycle and a same duty ratio, and the duty ratio is smaller than 0.5.

Correspondingly, there is further provided in an embodiment of the present disclosure a gate driving circuit comprising multiple shift registers connected in series provided in the embodiment of the present disclosure; herein, an input signal of a first stage of shift register is inputted from a start signal terminal; except for the first stage of shift register, input signals of remaining stages of shift registers are inputted from a driving signal output terminal of a previous stage of shift register connected thereto.

Correspondingly, there is further provided in an embodiment of the present disclosure an organic light-emitting display panel, comprising the gate driving circuit provided in the embodiment of the present disclosure.

Correspondingly, there is further provided in an embodiment of the present disclosure a display device, comprising the organic light-emitting display panel provided in the embodiment of the present disclosure.

The shift register, the gate driving circuit and the relevant display device provided in the embodiments of the present disclosure comprise: the first node controlling module, the second node controlling module, the third node controlling module, the first outputting module, and the second outputting module, wherein the first node controlling module adjusts the potential of the first node through the input signal, the first clock signal, the second clock signal, the first direct current signal and the potential of the second node, the second node controlling module adjusts the potential of the second node through the first clock signal, the second clock signal, the first direct current signal, the second direct current signal and the potential of the first node, the third node controlling module adjusts the potential of the third node through the second clock signal, the second direct current signal, the potential of the first node and the potential of the second node, the first outputting module adjusts the potential of the driving signal output terminal through the second direct current signal and the potential of the first node, and the second outputting module adjusts the potential of the driving signal output terminal though the first direct current signal and the potential of the third node. Through mutual coordination of the above five modules, the shift register could control the time length of the scanning signal outputted by the driving signal output terminal by only changing the time length of the input signal, without changing the clock signals, and changing the circuit and changing the process. Therefore, compared with the prior art where the time length of the scanning signal outputted by the driving signal output terminal is controlled by using various clock control signals, the present disclosure could reduce the difficulty of the gate driving circuit and solve the problem of process complexity, so as to reduce cost.

BRIEF DESCRIPTION OF THE DRAWINGS

FIGS. 3a-3c are circuit timing diagrams of the shift register as shown in FIG. 2a;

DETAILED DESCRIPTION

Specific implementations of a shift register, a gate driving circuit and a relevant display device provided in embodiments of the present disclosure will be described in detail by combining with figures.

Figure 1:
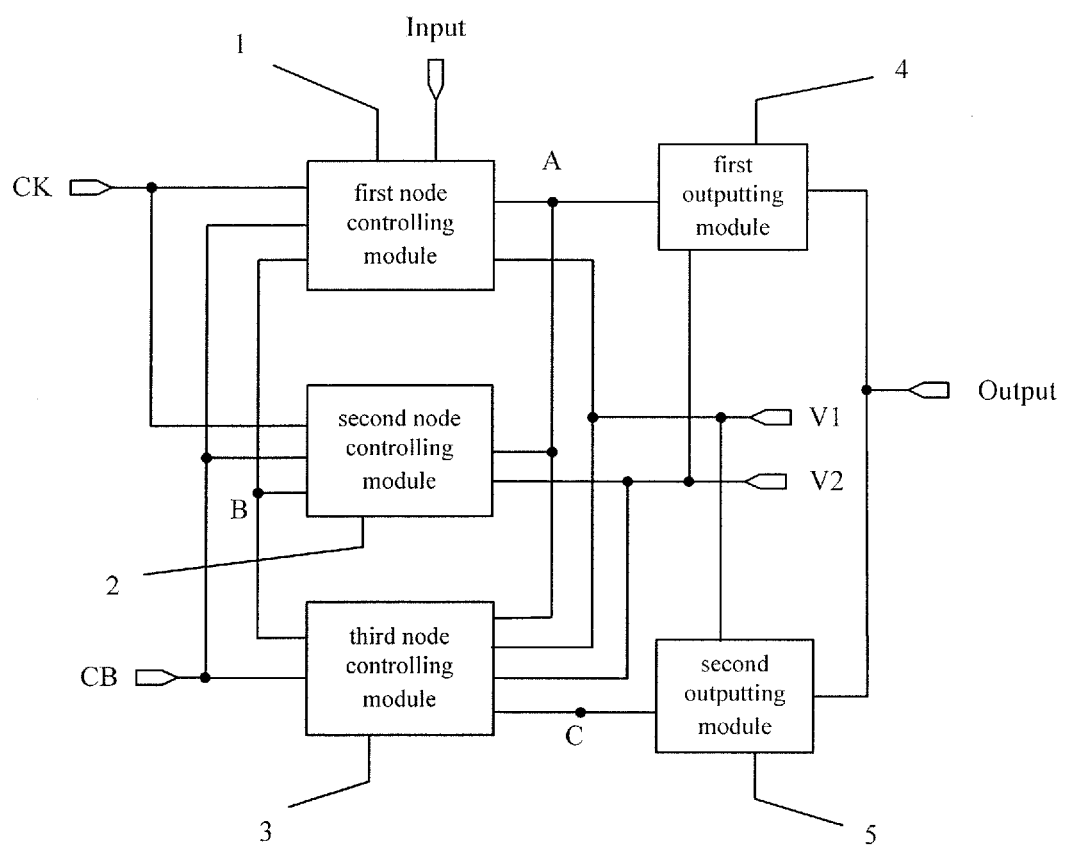
FIG. 1 is a schematic diagram of a structure of a shift register provided in an embodiment of the present disclosure.

FIG. 1 shows a schematic diagram of a structure provided in an embodiment of the present disclosure. As shown in FIG. 1, the shift register comprises: a first node controlling module 1, a second node controlling module 2, a third node controlling module 3, a first outputting module 4 and a second outputting module 5.

In the shift register as shown in FIG. 1, an input terminal of the first node controlling module 1 is used to receive an input signal Input, a second input terminal thereof is used to receive a first clock signal CK, a third input terminal thereof is used to receive a second clock signal CB, a fourth input terminal thereof is used to receive a first direct current signal V1, a fifth input terminal thereof is connected to a second node B, and an output terminal thereof is connected to a first node A; and the first node controlling module 1 is configured to provide the input signal Input to the first node A when a potential of the first clock signal CK is a first potential, provide the first direct current signal V1 to the first node A when both a potential of the second clock signal CB and a potential of the second node B are the first potential, and maintain a voltage difference between the third input terminal and the first node A to a voltage difference of a previous period of time when the first node A is in a floating status;

A first input terminal of the second node controlling module 2 is used to receive a second direct current signal V2, a second input terminal thereof is used to receive a first clock signal CK, a third input terminal thereof is used to receive a second clock signal CB, a fourth input terminal thereof is connected to the first node A, and an output terminal thereof is connected to the second node B; and the second node controlling module 2 is configured to provide the second direct current signal V2 to the second node B when a potential of the first clock signal CK is a first potential, provide the first clock signal CK to the second node B when a potential of the first node A is the first potential, and maintain a voltage difference between the third input terminal and the second node B to a voltage difference of the previous period of time when the second node B is in a floating status;

A first input terminal of the third node controlling module 3 is used to receive the second clock signal CB, a second input terminal thereof is used to receive the first direct current signal V1, a third input terminal thereof is used to receive the second direct current signal V2, a fourth input terminal thereof is connected to the first node A, a fifth input terminal thereof is connected to the second node B, and an output terminal thereof is connected to a third node C; and the third node controlling module 3 is configured to provide the first direct current signal V1 to the third node C when the potential of the first node A is the first potential, provide the second direct current signal V2 to the third node C when both the potential of the second clock signal CB and the potential of the second node B are the first potential, and maintain a voltage difference between the second input terminal and the third node C to a voltage difference of the previous period of time when the third node C is in a floating status;

A first input terminal of the first outputting module 4 is used to receive the second direct current signal V2, a second input terminal thereof is connected to the first node A, and an output terminal thereof is connected to a driving signal output terminal Output of the shift register; and the first outputting module 4 is configured to provide the second direct current signal V2 to the driving signal output terminal Output when the potential of the first node A is the first potential.

A first input terminal of the second output module 5 is used to receive the first direct current signal V1, a second input terminal thereof is connected to the third node C, and an output terminal thereof is connected to the driving signal output terminal Output of the shift register; and the second output module 5 is configured to provide the first direct current signal V1 to the driving signal output terminal Output when the potential of the third node C is the first potential.

Alternatively, when a valid pulse signal of the input signal Input is a high potential, the first potential is a low potential, the potential of the first direct current signal V1 is a high potential, and the potential of the second direct current signal V2 is a low potential; or when a valid pulse signal of the input signal Input is a low potential, the first potential is a high potential, the potential of the first direct current signal V1 is a low potential, and the potential of the second direct current signal V2 is a high potential.

The shift register, the gate driving circuit and the relevant display device provided in the embodiment of the present disclosure comprise: the first node controlling module, the second node controlling module, the third node controlling module, the first outputting module, and the second outputting module, wherein the first node controlling module adjusts the potential of the first node through the input signal, the first clock signal, the second clock signal, the first direct current signal and the potential of the second node, the second node controlling module adjusts the potential of the second node through the first clock signal, the second clock signal, the first direct current signal, the second direct current signal and the potential of the first node, the third node controlling module adjusts the potential of the third node through the second clock signal, the second direct current signal, the potential of the first node and the potential of the second node, the first outputting module adjusts the potential of the driving signal output terminal through the second direct current signal and the potential of the first node, and the second outputting module adjusts the potential of the driving signal output terminal though the first direct current signal and the potential of the third node. Through mutual coordination of the above five modules, the shift register could control the time length of the scanning signal outputted by the driving signal output terminal by only changing the time length of the input signal, without changing the clock signal, changing the circuit and changing the process. Therefore, compared with the prior art where the time length of the scanning signal outputted by the driving signal output terminal is controlled by using various clock control signals, the present disclosure could reduce difficulty of the gate driving circuit and solve problem of process complexity, so as to reduce cost.

It should be noted that, in the shift register provided in the embodiment of the present disclosure, when the valid pulse signal of the input signal is a high potential, a rising edge of the input signal aligns with a falling edge of the first clock signal and a rising edge of the second clock signal, and a falling edge of the input signal aligns with a rising edge of the first clock signal; the first clock signal and the second clock signal have a same cycle and a same duty ratio, and the duty ratio is greater than 0.5; or, when the valid pulse signal of the input signal is a low potential, the falling edge of the input signal aligns with the rising edge of the first clock signal and the falling edge of the second clock signal, and the rising edge of the input signal aligns with the falling edge of the first clock signal. The first clock signal and the second clock signal have a same cycle and a same duty ratio, and the duty ratio is smaller than 0.5.

Principles of the present disclosure will be described in detail in connection with specific embodiments. It should be noted that the embodiments are used to explain the principles of the present disclosure to the better, but not used to limit the scope of the present disclosure.

Figure 2A:
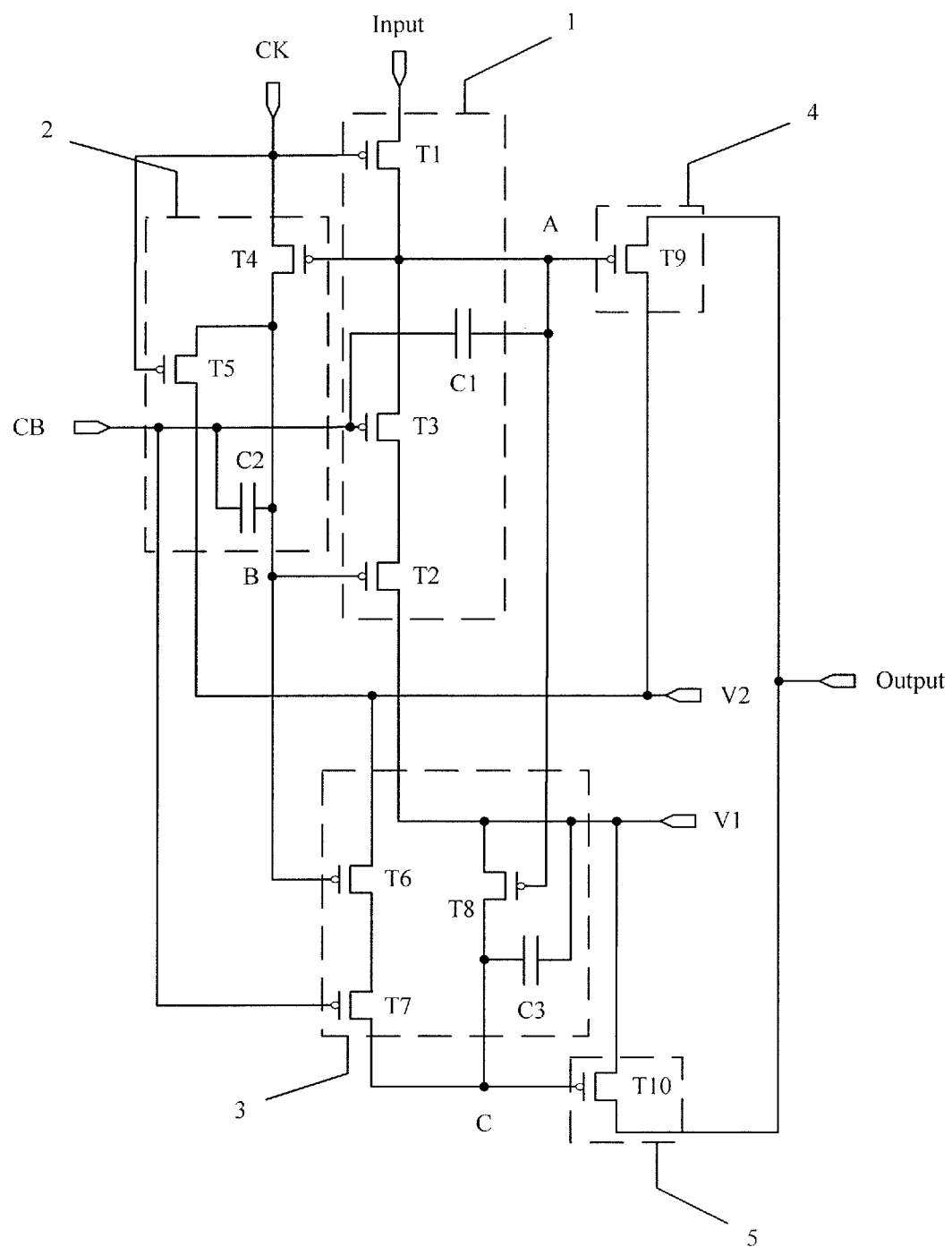
FIG. 2a is a schematic diagram of an exemplary structure of a shift register provided in an embodiment of the present disclosure.
Figure 2B:
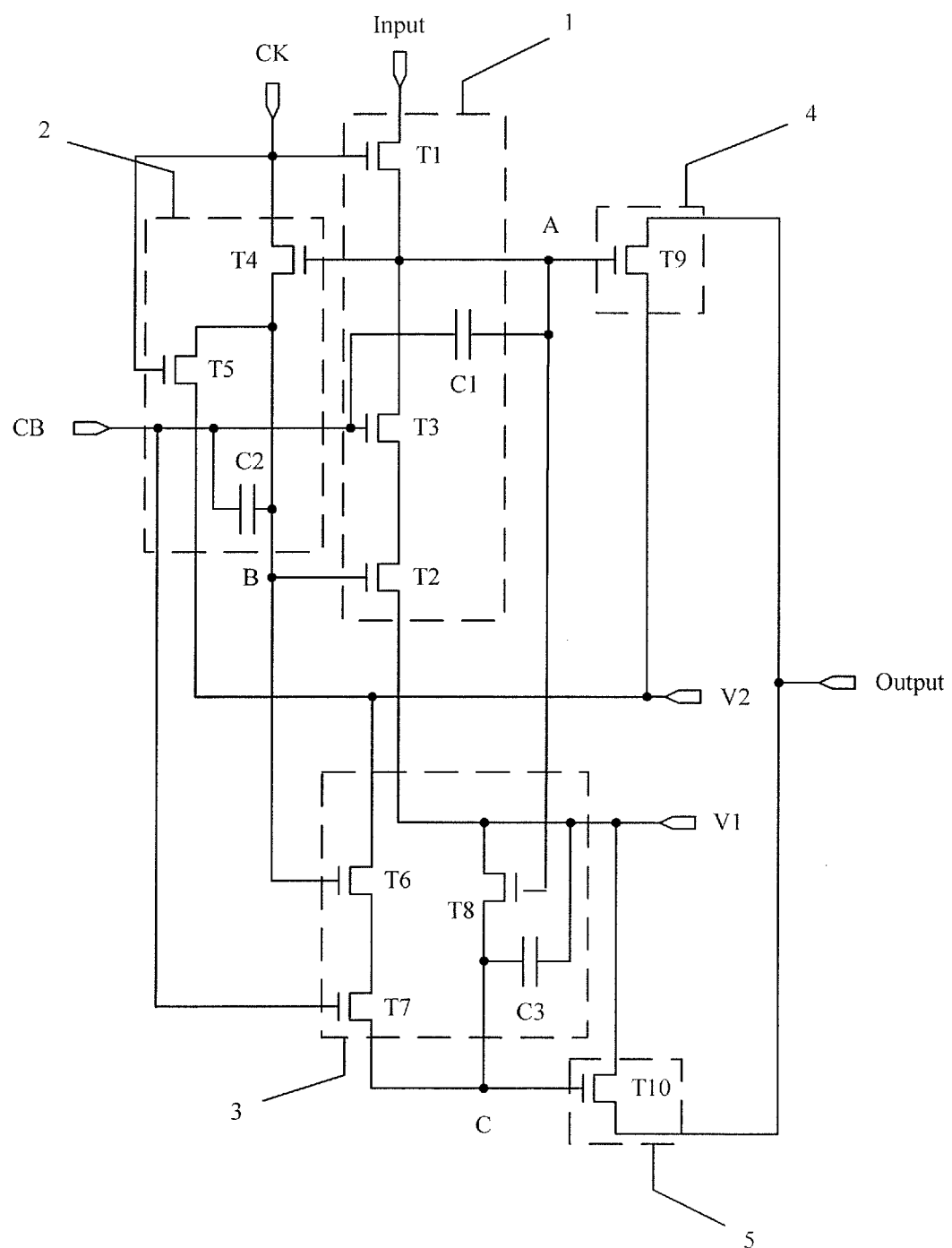
FIG. 2b is a schematic diagram of another exemplary structure of a shift register provided in an embodiment of the present disclosure.

FIGS. 2a and 2b show schematic diagram of exemplary structures of a shift register provided in an embodiment of the present disclosure. In order to facilitate implementation, in the shift register provided in the embodiment of the present disclosure, as shown in FIGS. 2a and 2b, the first node controlling module 1 can comprise: a first switch transistor T1, a second switch transistor T2, a third switch transistor T3 and a first capacitor C1.

A gate of the first switch transistor T1 is used to receive the first clock signal CK, a source thereof is used to receive the input signal Input, and a drain thereof is connected to the first node A.

A gate of the second switch transistor T2 is connected to the second node B, a source thereof is used to receive the first direct current signal V1, and a drain thereof is connected to a source of the third switch transistor T3.

A gate of the third switch transistor T3 is used to receive the second clock signal CB, and a drain thereof is connected to the first node A.

One terminal of the first capacitor C1 is connected to the first node A, and another terminal thereof is used to receive the second clock signal CB.

Further, as shown in FIG. 2a, the first switch transistor T1, the second switch transistor T2 and the third switch transistor T3 could be P type transistors. Or, as shown in FIG. 2b, the first switch transistor T1, the second switch transistor T2 and the third switch transistor T3 could be N type transistor, to which no limitation is given.

In specific implementation, when the first switch transistor T1 is in a turn-on state under the control of the first clock signal CK, the input signal Input is provided to the first node A. When the second switch transistor T2 is in the turn-on state under the control of the potential of the second node B and the third switch transistor T3 is in the turn-on state under the control of the second clock signal CB, the first direct current signal V1 is provided to the first node A. And when the first node A is in a floating state, according to bootstrap effect of the first capacitor C1, a voltage difference between the third input terminal of the first node controlling module 1 and the first node A is maintained to a voltage difference of the previous period of time.

The above description just explains the specific structure of the first node controlling module 1 in the shift register by taking examples. In specific implementation, the specific structure of the first node control module 1 is not limited to the above structure provided in the embodiment of the present disclosure, but could be other structures known by those skilled in the art, to which no limitation is given herein.

Alternatively, in the shift register provided in the embodiment of the present disclosure, as shown in FIGS. 2a and 2b, the second node controlling module can comprise: a fourth switch transistor T4, a fifth switch transistor T5 and a second capacitor C2.

A gate of the fourth switch transistor T4 is connected to the first node A, a source thereof is used to receive the first clock signal CK, and a drain thereof is connected to the second node B.

A gate of the fifth switch transistor T5 is used to receive the first clock signal CK, a source thereof is used to receive the second direct current signal V2, and a drain thereof is connected to the second node B.

One terminal of the second capacitor C2 is connected to the second node B, and the other terminal thereof is used to receive the second clock signal CB.

Further, as shown in FIG. 2a, both the fourth switch transistor T4 and the fifth switch transistor T5 are P type transistors. Or, as shown in FIG. 2b, both the fourth switch transistor T4 and the fifth switch transistor T5 could be N type transistor, to which no limitation is given herein.

In specific implementation, when the fourth switch transistor T4 is in the turn-on state under the control of the first node A, the first clock signal CK is provided to the second node B; when the fifth switch transistor T5 is in the turn-on stage under the control of the first clock signal CK, the second direct current signal V2 is provided to the second node B; and when the second node B is in a floating state, according to bootstrap effect of the second capacitor C2, a voltage difference between the third input terminal of the second node controlling module 2 and the second node B is maintained to a voltage difference of the previous period of time.

The above description just explains the specific structure of the second node controlling module in the shift register by taking examples. In specific implementation, the specific structure of the second node control module is not limited to the above structure provided in the embodiment of the present disclosure, but could be other structures known by those skilled in the art, to which no limitation is given herein.

Alternatively, in the shift register provided in the embodiment of the present disclosure, as shown in FIGS. 2a and 2b, the third node controlling module 3 could comprise: a sixth switch transistor T6, a seventh switch transistor T7, an eighth switch transistor T8 and a third capacitor C3.

A gate of the sixth switch transistor T6 is connected to the second node B, a source thereof is used to receive the second direct current signal V2, and a drain thereof is connected to a source of the seventh switch transistor T7.

A gate of the seventh switch transistor T7 is used to receive the second clock signal CB, and a drain thereof is connected to the third node C.

A gate of the eighth switch transistor T8 is connected to the first node A, a source thereof is used to receive the first direct current signal V1, and a drain thereof is connected to the third node C.

One terminal of the third capacitor C3 is connected to the third node C, and the other terminal is used to receive the first direct current signal V1.

Further, as shown in FIG. 2a, the sixth switch transistor T6, the seventh switch transistor T7, and the eighth switch transistor T8 could be P type transistors. Or, as shown in FIG. 2b, the sixth switch transistor T6, the seventh switch transistor T7, and the eighth switch transistor T8 could be N type transistors, to which no limitation is given.

In specific implementation, when the sixth switch transistor T6 is in the turn-on state under the control of the second node B and the seventh switch transistor T7 is in the turn-on state under the control of the second clock signal CB, the second direct current signal V2 is provided to the third node C; and when the third node C is in a floating state, according to the bootstrap effect of the third capacitor C3, a voltage difference between the second input terminal of the third node controlling module 3 and the third node C is maintained to a voltage difference of the previous period of time.

The above description just explains the specific structure of the third node controlling module in the shift register by taking examples. In specific implementation, the specific structure of the third node control module is not limited to the above structure provided in the embodiment of the present disclosure, but could be other structures known by those skilled in the art, to which no limitation is given herein.

Alternatively, in specific implementation, in the shift register provided in the embodiment of the present disclosure, as shown in FIGS. 2a and 2b, the first outputting module 4 could comprise: a ninth switch transistor T9.

A gate of the ninth switch transistor T9 is connected to the first node A, a source thereof is used to receive the second direct current signal V2, and a drain thereof is connected to the driving signal output terminal Output.

Further, as shown in FIG. 2a, the ninth switch transistor T9 could be a P type transistor. Or, as shown in FIG. 2b, the ninth switch transistor T9 could be an N type transistor, to which no limitation is given herein.

In specific implementation, when the ninth switch transistor T9 is in the turn-on state under the control of the potential of the first node A, the second direct current signal V2 is provided to the driving signal output terminal Output.

The above description just explains the specific structure of the first outputting module in the shift register by taking examples. In specific implementation, the specific structure of the first outputting module is not limited to the above structure provided in the embodiment of the present disclosure, but could be other structures known by those skilled in the art, to which no limitation is given herein.

Alternatively, in the shift register provided in the embodiment of the present disclosure, as shown in FIGS. 2a and 2b, the second output module 5 could comprise: a tenth switch transistor T10.

A gate of the tenth switch transistor T10 is connected to the third node C, a source thereof is used to receive the first direct current signal V1, and a drain thereof is connected to the driving signal output terminal Output.

Further, as shown in FIG. 2a, the tenth switch transistor T10 could be a P type transistor. Or, as shown in FIG. 2b, the tenth switch transistor T10 could be an N type transistor, to which no limitation is given herein.

In specific implementation, when the tenth switch transistor T10 is in the turn-on state under the control the potential of the third node C, the first direct current signal V1 is provided to the driving signal output terminal Output.

Alternatively, in the shift register provided in the embodiment of the present disclosure, transistors generally adopt a same material. In specific implementation, when the valid pulse signal of the input signal is a high potential, all the switch transistors are P type transistors, and the potential of the first direct current signal is the high potential, and the potential of the second direct current signal is the low potential; and when the valid pulse signal of the input signal is the low potential, all the switch transistors are N type transistors, and the potential of the first direct current signal is the low potential, the potential of the second direct current signal is the high potential.

In specific implementation, the P type transistor is turned off under the effect of the high potential and turned on under the effect of the low potential; the N type switch transistor is turned on under the effect of the high potential and turned off under the effect of the low potential.

It should be noted that the switch transistors mentioned in the above embodiments of the present disclosure could be thin film transistors (TFT), or could be metal oxide semiconductors (MOS), to which no limitation is given herein. In specific implementation, functions of sources and drains of these transistors could be exchanged with each other depending on different types of transistors and input signals, to which no specific distinction is made herein.

Operation processes of the shift register provided in the embodiment of the present disclosure will be described by combining with circuit timing diagrams. In the following description, 1 represents a high potential signal, and 0 represents a low potential signal.

Embodiment 1

Figure 3A:
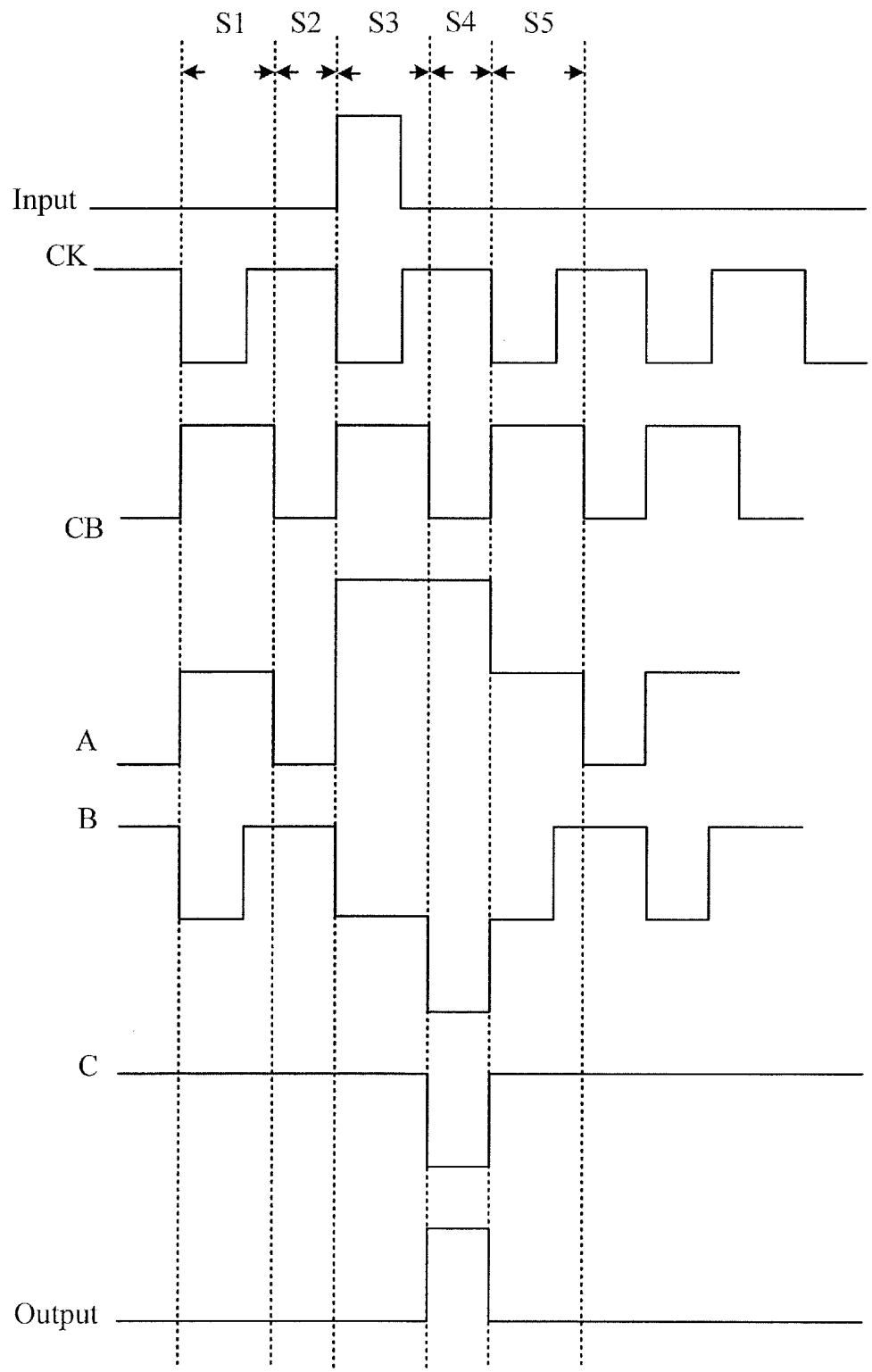

An operation process of the shift register is described by taking the structure of the shift register as shown in FIG. 2a as an example. In the shift register as shown in FIG. 2a, all of the switch transistors are P type transistors. The respective P type transistors are turned off under the effect of the high potential and turned on under the effect of the low potential. The first clock signal CK and the second clock signal CB have the same cycle and same duty ratio, and the duty ratio of both the first clock signal CK and the second clock signal CB are greater than 0.5. The potential of the first direct current signal V1 is the high potential, and the potential of the second direct current signal V2 is the low potential. The corresponding input/output timing diagram is as shown in FIG. 3a. In particular, five phases S1, S2, S3, S4 and S5 in the input/output timing diagram as shown in FIG. 3a are selected.

As shown in FIG. 3a, in phase S1, during a first half period of time, Input=0, CK=0, and CB=1. Since CK=0, the first switch transistor T1 is turned on. Since the first switch transistor T1 is turned on and provides the input signal Input to the first node A, the potential of the first node A is the low potential. Since CB=1, the first capacitor C1 starts to be charged. Since the potential of the first node A is the low potential, the fourth switch transistor T4, the eighth switch transistor T8 and the ninth switch transistor T9 are turned on. Since CK=0 and the fifth switch transistor T5 is turned on and provides the potential of the second direct current signal V2 to the second node B, the potential of the second node B is the low potential. Since CB=1, the second capacitor C2 starts to be charged. Since the potential of the second node B is the low potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=1, the third switch transistor T3 and the seventh switch transistor T7 are turned off. Since the eighth transistor T8 is turned on and provides the potential of the first direct current signal V1 to the third node C, the potential of the third node C is the high potential. Since the potential of the third node C is the high potential, the tenth switch transistor T10 is turned off. Since the ninth switch transistor T9 is turned on and provides the second direct current signal V2 to the driving signal output terminal Output, the driving signal output terminal Output outputs a scanning signal with the low potential.

During a second half period of time, Input=0, CK=1, CB=1. Since CK=1, the first switch transistor T1 and the fifth switch transistor T5 are turned off. Since CB=1, according to the bootstrap effect of the first capacitor C1, in order to maintain the voltage difference between two terminals of the first capacitor C1, the potential of the first node A maintains to the low potential of the previous period of time, so as to ensure that the fourth switch transistor T4, the eighth switch transistor T8 and the ninth switch transistor T9 are turned on in this phase. Since the fourth switch transistor T4 is turned on and provides the first clock signal CK with the high potential to the second node B, the potential of the second node B is the high potential. Since CB=1 and the potential of the second node B is the high potential, the second switch transistor T2, the third switch transistor T3, the sixth switch transistor T6 and the seventh switch transistor T7 are turned off. Since the eighth transistor T8 is turned on and provides the potential of the first direct current signal V1 to the third node C, the potential of the third node C is the high potential. Since the potential of the third node C is the high potential, the tenth switch transistor T10 is turned off. Since the ninth switch transistor T9 is turned on and provides the second direct current signal V2 to the driving signal output terminal Output, the driving signal output terminal Output outputs a scanning signal with the low potential.

In phase S2, Input=0, CK=1, CB=0. Since CK=1, the first switch transistor T1 and the fifth switch transistor T5 are turned off. Since CB=0, according to the bootstrap effect of the first capacitor C1, in order to maintain the voltage difference between two terminals of the first capacitor C1, the potential of the first node A is further pulled down, so as to ensure that the fourth switch transistor T4, the eighth switch transistor T8 and the ninth switch transistor T9 are turned on in this phase. Since the fourth switch transistor T4 is turned on, the first clock signal CK with the high potential is provided to the second node B, and thus the potential of the second node B is the high potential. Since the potential of the second node B is the high potential, the second switch transistor T2 and the sixth switch transistor T6 are turned off. Since the eighth transistor T8 is turned on, the potential of the first direct current signal V1 is provided to the third node C, the potential of the third node C is the high potential. Since the potential of the third node C is the high potential, the tenth switch transistor T10 is turned off. Since the ninth switch transistor T9 is turned on and provides the second direct current signal V2 to the driving signal output terminal Output, the driving signal output terminal Output outputs the scanning signal with the low potential.

In phase S3, during the first half period of time, Input=1, CK=0, CB=1. Since CK=0, the first switch transistor T1 is turned on. Since the first switch transistor is turned on and provides the input signal Input to the first node A, the potential of the first node A is the high potential. Since the potential of the first node A is the high potential, the fourth switch transistor T4, the eighth switch transistor T8 and the ninth switch transistor T9 are turned off. Since CK=0 and the fifth switch transistor T5 is turned on and provides the potential of the second direct current signal V2 to the second node B, the potential of the second node B is the low potential. Since CB=1, the second capacitor C2 starts to be charged. Since the potential of the second node B is the low potential, both the second switch transistor T2 and the sixth switch transistor T6 are turned on, the second switch transistor T2 provides the first direct current signal V1 to the third switch transistor T3, the sixth switch transistor T6 provides the second direct current signal V2 to seventh switch transistor T7. Since CB=1, the third switch transistor T3 and the seventh switch transistor T7 are turned off. Therefore, the driving signal output terminal Output outputs the scanning signal with the low potential maintained in phase S2.

During the second half period of time, Input=0, CK=1, CB=1. Since CK=1, the first switch transistor T1 and the fifth switch transistor T5 are turned off. Since CB=1, according to the bootstrap effect of the second capacitor C2, in order to maintain the voltage difference between the two terminals of the second capacitor C2, the potential of the second node B is maintained to the low potential of the previous period of time, so as to ensure that the second switch transistor T2 and the sixth switch transistor T6 in this phase are turned on. Since CB=1, both the third switch transistor T3 and the seventh switch transistor T7 are turned off. Therefore, the driving signal output terminal Output outputs the scanning signal with the low potential maintained to the previous period of time of phase S3.

In phase S4, Input=0, CK=1, CB=0. Since CK=1, the first switch transistor T1 and the fifth switch transistor T5 are turned off. Since CB=0, according to the bootstrap effect of the second capacitor C2, in order to maintain the voltage difference between the two terminals of the second capacitor C2, the potential of the second node B is further pulled down, so as to ensure that both the second switch transistor T2 and the sixth switch transistor T6 are turned on in this phase. Since CB=0, both the third switch transistor T3 and the seventh switch transistor T7 are turned on. Since both the second switch transistor T2 and the third transistor T3 are turned on, the first clock signal CK with the high potential is provided to the first node A through the second switch transistor T2 and the third switch transistor T3, and thus the potential of the first node A is the high potential. Since the potential of the first node A is the high potential, the fourth switch transistor T4, the eighth switch transistor T8 and the ninth switch transistor T9 are turned off. Since both the sixth switch transistor T6 and the seventh transistor T7 are turned on and provide the second direct current signal V2 to the third node C through the sixth switch transistor T6 and the seventh transistor T7, the potential of the third node C is the low potential, and thus the third capacitor C3 starts to be charged. Since the potential of the third node C is the low potential, the tenth switch transistor T10 is turned on. Since the tenth switch transistor T10 is turned on and provides the first direct current signal V1 to the driving signal output terminal Output, the driving signal output terminal Output outputs the scanning signal with the high potential.

In phase S5, during the first half period of time, Input=0, CK=0, CB=1. Since CK=0, the first switch transistor T1 is turned on. Since the first switch transistor T1 is turned on and provides the input signal Input to the first node A, the potential of the first node A is the low potential. Since CB=1, the first capacitor C1 starts to be charged. Since the potential of the first node A is the low potential, the fourth switch transistor T4, the eighth switch transistor T8 and the ninth switch transistor T9 are turned on. Since CK=0, and the fifth switch transistor T5 is turned on and provides the potential of the second direct current signal V2 to the second node B, the potential of the second node B is the low potential. Since CB=1, the second capacitor C2 starts to be charged. Since the potential of the second node is the low potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=1, the third switch transistor T3 and the seventh switch transistor T7 are turned off. Since the eighth transistor T8 is turned on and provides the potential of the first direct current signal V1 to the third node C, the potential of the third node C is the high potential. Since the potential of the third node C is the high potential, the tenth switch transistor T10 is turned off. Since the ninth switch transistor T9 is turned on and provides the second direct current signal V2 to the driving signal output terminal Output, the driving signal output terminal Output outputs the scanning signal with the low potential.

During the second half period of time, Input=0, CK=1, CB=1. Since CK=1, the first switch transistor T1 and the fifth switch transistor T5 are turned off. Since CB=1, according to the bootstrap effect of the first capacitor C1, in order to maintain the voltage difference between two terminals of the first capacitor C1, the potential of the first node A maintains to the low potential of the previous period of time, so as to ensure that the fourth switch transistor T4, the eighth switch transistor T8 and the ninth switch transistor T9 are turned on in this phase. Since the fourth switch transistor T4 is turned on, the first clock signal CK with the high potential is provided to the second node B, and thus the potential of the second node B is the high potential. Since CB=1 and the potential of the second node B is the high potential, the second switch transistor T2, the third switch transistor T3, the sixth switch transistor T6 and the seventh switch transistor T7 are turned off Since the eighth switch transistor T8 is turned on and provides the potential of the first direct current signal V1 to the third node C, the potential of the third node C is the high potential. Since the potential of the third node C is the high potential, the tenth switch transistor T10 is turned off. Since the ninth switch transistor T9 is turned on and provides the second direct current signal V2 to the driving signal output terminal Output, the driving signal output terminal Output outputs the scanning signal with the low potential.

After phase S5, the shift register provided in the embodiment of the present disclosure keeps repeating execution of phases S2 and S1 until the next frame starts.

Embodiment 2

Figure 3B:
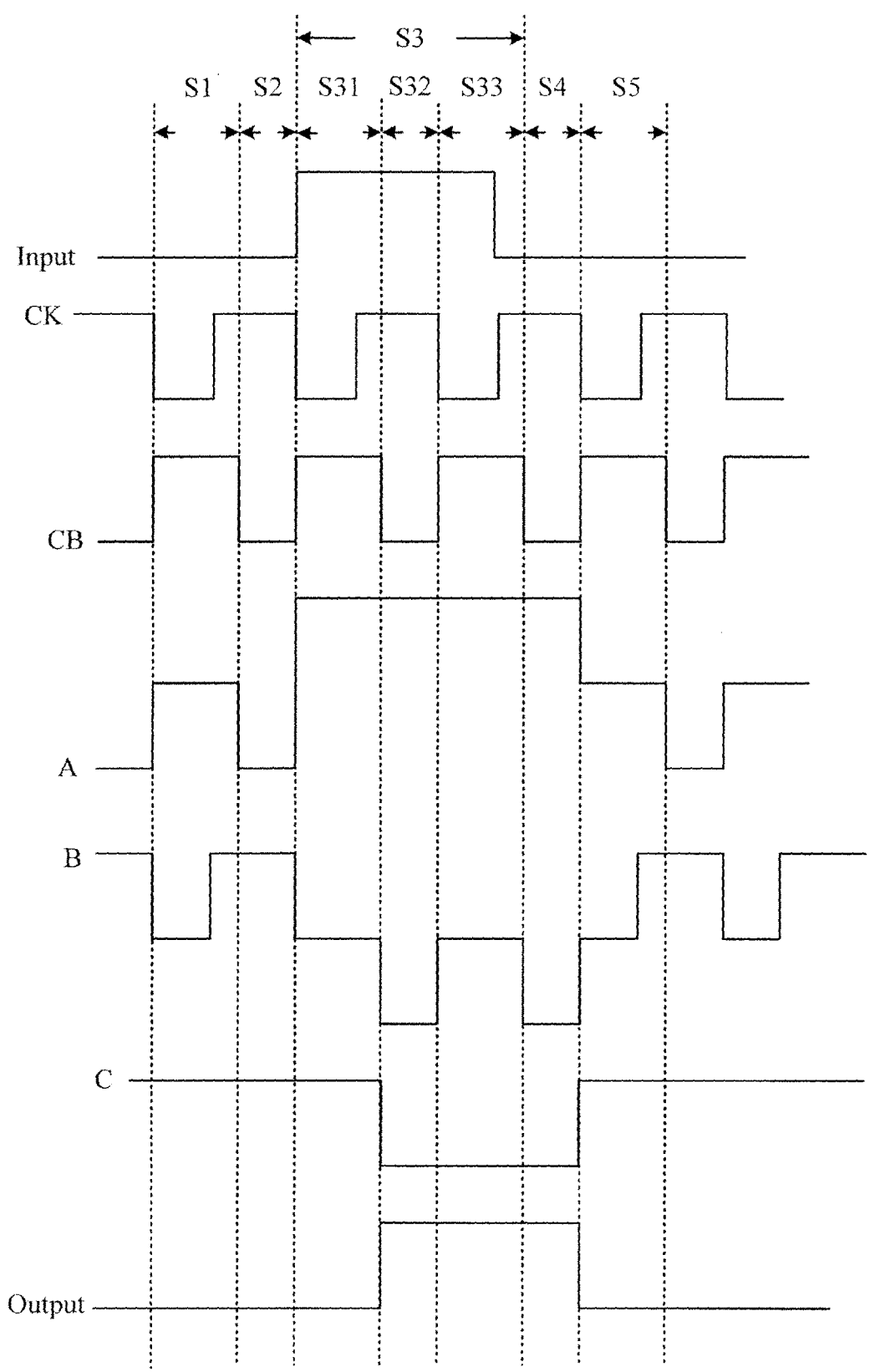

The operation process of the shift register is described by taking the structure of the shift register as shown in FIG. 2a as an example. On the basis of Embodiment 1, the time length of the valid pulse signal of the input signal Input is prolonged one clock signal cycle, and its corresponding input/output timing diagram is as shown in FIG. 3b. In particular, five phases S1, S2, S3, S4, and S5 in the input/output timing diagram as shown in FIG. 3b are selected, wherein phase S3 is divided into three phases S31, S32, and S33.

In phase S1, during the first half period of time, Input=0, CK=0, CB=1. During the second half period of time, Input=0, CK=1, CB-1. The specific operation process is the same as the operation process in phase S1 in Embodiment 1. Thus, no further description is given herein.

In phase S2, Input=0, CK=1, CB=0, The specific operation process is the same as the operation process in phase S2 in Embodiment 1. Thus, no further description is given herein.

In phase S3, during the first half period of time in phase S31, Input=1, CK=0, CB=1. Since CK=0, the first switch transistor T1 is turned on. Since the first switch transistor T1 is turned on and provides the input signal Input to the first node A, the potential of the first node A is the high potential. Since the potential of the first node A is the high potential, the fourth switch transistor T4, the eighth switch transistor T8 and the ninth switch transistor T9 are turned off. Since CK=0 and the fifth switch transistor T5 is turned on and provides the potential of the second direct current signal V2 to the second node B, the potential of the second node B is the low potential. Since CB=1, the second capacitor C2 starts to be charged. Since the potential of the second node B is the low potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=1, the third switch transistor T3 and the seventh switch transistor T7 are turned off Therefore, the driving signal output terminal Output outputs the scanning signal with the low potential maintained in phase S2.

During the second half period of time, Input=1, CK=1, CB=1. Since CK=1, both the first switch transistor T1 and the fifth switch transistor T5 are turned off. Since CB=1, according to the bootstrap effect of the first capacitor C1, in order to maintain the voltage difference between the two terminals of the first capacitor C1, the potential of the first node A is still the high potential, so as to ensure that the fourth switch transistor T4, the eighth switch transistor T8 and the ninth switch transistor T9 are turned off in this phase. Since CB=1, according to the bootstrap effect of the second capacitor, in order to maintain the voltage difference between the two terminals of the second capacitor C2, the potential of the second node B is still the low potential, so as to ensure that both the second switch transistor T2 and the sixth switch transistor T6 are turned on in this phase. Since CB=1, both the third switch transistor T3 and the seventh switch transistor T7 are turned off. Therefore, the driving signal output terminal Output outputs the scanning signal with the low potential maintained to the previous period of time of phase S3.

In phase S32, Input=1, CK=1, CB=0. Since CK=1, both the first switch transistor T1 and the fifth switch transistor T5 are turned off. Since CB=0, according to the bootstrap effect of the second capacitor C2, in order to maintain the voltage difference between the two terminal of the second capacitor C2, the potential of the second node B is further pulled down, so as to ensure that both the second switch transistor T2 and the sixth switch transistor T6 are turned on in this phase. Since CB=0, both the third transistor T3 and the seventh transistor T7 are turned on. Since both the second switch transistor T2 and the third transistor T3 are turned on, the first clock signal CK with the high potential is provided to the first node A through the second switch transistor T2 and the third switch transistor T3, and thus the potential of the first node A is the high potential. Since the potential of the first node A is the high potential, the fourth switch transistor T4, the eighth switch transistor T8 and the ninth switch transistor T9 are turned off. Both the sixth switch transistor T6 and the seventh switch transistor T7 are turned on and the second direct current signal V2 is provided to the third node C through the sixth switch transistor T6 and the seventh switch transistor T7, and thus the potential of the third node C is the low potential, and the third capacitor C3 starts to be charged. Since the potential of the third node C is the low potential, the tenth switch transistor T10 is turned on. Since the tenth switch transistor T10 is turned on and provides the first direct current signal V1 to the driving signal output terminal Output, the driving signal output terminal Output outputs the scanning signal with the high potential.

During the first half period of time of phase S33, Input=1, CK=0, CB=1. Since CK=0, the first switch transistor T1 is turned on. Since the first switch transistor T1 is turned on and provides the input signal Input to the first node A, the potential of the first node A is the high potential. Since the potential of the first node A is the high potential, the fourth switch transistor T4, the eighth switch transistor T8 and the ninth switch transistor T9 are turned off. Since CK=0, and the fifth switch transistor T5 is turned on and provides the potential of the second direct current signal V2 to the second node B, the potential of the second node B is the low potential. Since CB=1, the second capacitor C2 starts to be charged. Since the potential of the second potential B is the low potential, both second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=1, the third switch transistor T3 and the seventh switch transistor T7 are turned off. According to the bootstrap effect of the third capacitor C3, in order to maintain the voltage difference between the two terminals of the third capacitor C3, the potential of the third node C is the low potential. Since the potential of the third node C is the low potential, the tenth switch transistor T10 is turned on. Since the tenth switch transistor T10 is turned on and provides the first direct current signal V1 to the driving signal output terminal Output, the driving signal output terminal Output outputs the scanning signal with the high potential.

During the second half period of time, Input=0, CK=1, CB=1. Since CK=1, both the first switch transistor T1 and the fifth switch transistor T5 are turned off. Since CB=1, according to the bootstrap effect of the second capacitor C2, in order to maintain the voltage different between the two terminals of the second capacitor C2, the potential of the second node B is the low potential. Since the potential of the second node B is the low potential, both the second switch transistor T2 and the sixth switch transistor T6 are turned on. Since CB=1, both the third switch transistor T3 and the seventh switch transistor T7 are turned off. According to the bootstrap effect of the third capacitor C3, in order to maintain the voltage difference between the two terminals of the third capacitor C3, the potential of the third node C is the low potential. Since the potential of the third node C is the low potential, the tenth switch transistor T10 is turned on. Since the tenth switch transistor T10 is turned on and provides the first direct current signal V1 to the driving signal output terminal Output, the driving signal output terminal Output outputs the scanning signal with the high potential.

In phase S4, Input=0, CK=1, CB=0. The specific operation process is the same as the operation process in phase S4 in Embodiment 1. Thus, no further description is given herein.

In phase S5, during the first half period of time, Input=0, CK=0, CB=1. During the second half period of time, Input=0, CK=1, CB=1. The specific operation process is the same as the operation process in phase S5 in Embodiment 1. Thus, no further description is given herein.

After the phase S5, the shift register provided in the embodiment of the present disclosure keeps repeating execution of phases S2 and S1 until the next frame starts.

Embodiment 3

Figure 3C:
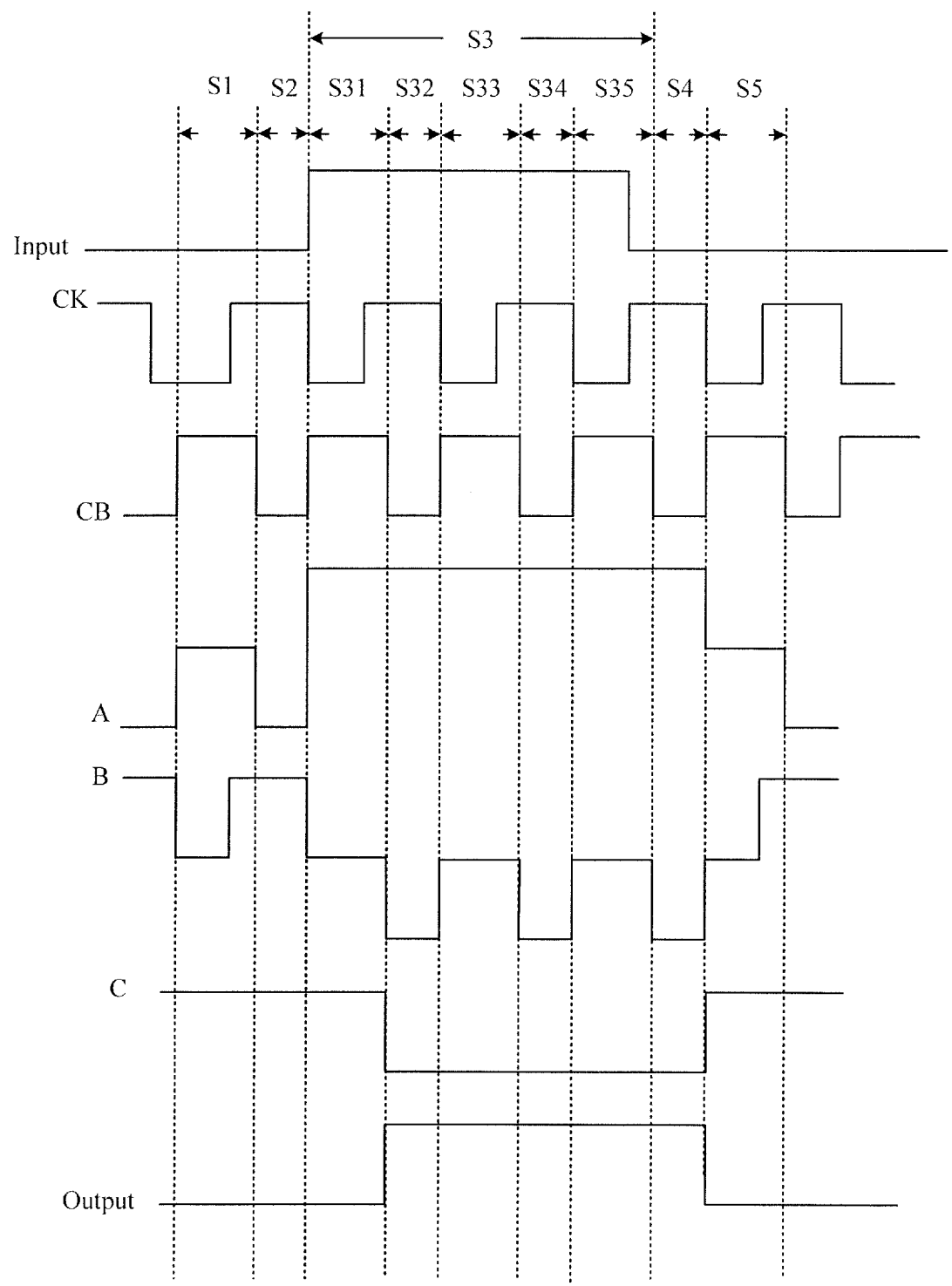

The operation process of the shift register is described by taking the structure of the shift register as shown in FIG. 2a as an example. On the basis of Embodiment 2, the time length of the valid pulse signal of the input signal Input is prolonged one clock signal cycle, and its corresponding input/output timing diagram is as shown in FIG. 3c. In particular, five phases S1, S2, S3, S4, and S5 in the input/output timing diagram as shown in FIG. 3c are selected, wherein phase S3 includes five phases S31, S32, S33, S34, and S35 respectively.

In phase S1, during the first half period of time, Input=0, CK=0, CB=1. During the second half period of time, Input=0, CK=1, CB=1. The specific operation process is the same as the operation process of phase S1 in Embodiment 1. Thus, no further description is given herein.

In phase S2, Input=0, CK=1, CB=0. The specific operation process is the same as the operation process in phase S2 in Embodiment 1. Thus, no further description is given herein.

In phase S3, during the first half period of time in phase S31, Input=1, CK=0, CB=1. During the second half period time of phase S31, Input=1, CK=1, CB=1. The specific operation process is the same as the operation process in phase S31 in Embodiment 2. Thus, no further description is given herein.

In phase S32, Input=1, CK=1, CB=0. The specific operation process is the same as the operation process in phase S32 in Embodiment 2. Thus, no further description is given herein.

In phase S33, during the first half period of time, Input=1, CK=0, CB=1. Since CK=0, the first switch transistor T1 is turned on. Since the first switch transistor T1 is turned on and provides the input signal Input to the first node A, the potential of the first node A is the high potential. Since the potential of the first node A is the high potential, the fourth switch transistor T4, the eighth switch transistor T8 and the ninth switch transistor T9 are turned off. Since CK=0, and the fifth switch transistor T5 is turned on and provides the potential of the second direct current signal V2 to the second node B, the potential of the second node B is the low potential. Since CB=1, the second capacitor C2 starts to be charged. Since the potential of the second node B is the low potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=1, the third switch transistor T3 and the seventh switch transistor T7 are turned off. Therefore, the driving signal output terminal Output outputs the scanning signal with the low potential maintained to the phase S2.

During the second half period of time, Input=1, CK=1, CB=1. Since CK=1, both the first switch transistor T1 and the fifth switch transistor T5 are turned off. Since CB=1, according to the bootstrap effect of the first capacitor C1, in order to maintain the voltage difference between the two terminals of the first capacitor C1, the potential of the first node A is still the high potential, so as to ensure that the fourth switch transistor T4, the eighth switch transistor T8 and the ninth switch transistor T9 are turned off in this phase. Since CB=1, according to the bootstrap effect of the second capacitor C2, in order to maintain the voltage difference between the two terminals of the second capacitor C2, the potential of the second node B is still the low potential, so as to ensure that both the second switch transistor T2 and the sixth switch transistor T6 are turned on in this phase. Since CB=1, both third switch transistor T3 and the seventh switch transistor T7 are turned off. Therefore, the driving signal output terminal Output outputs the scanning signal with the low potential maintained to the previous period of time of phase S3. It can be seen that the operation process of phase S33 is the same as the operation process of phase S31.

In phase S34, Input=1, CK=1, CB=0. Since CK=1, both the first switch transistor T1 and the fifth switch transistor T5 are turned off. Since CB=0, according to the bootstrap effect of the second capacitor C2, in order to maintain the voltage difference between the two terminals of the second capacitor C2, the potential of the second node B is further pulled down, so as to ensure that both the second switch transistor T2 and the six switch transistor T6 are turned on in this phase. Since CB=0, both the third transistor T3 and the seventh switch transistor T7 are turned on. Since both the second switch transistor T2 and the third switch transistor T3 are turned on, the first clock signal CK with the high potential is provided to the first node A through the second switch transistor T2 and the third switch transistor T3, and thus the potential of the first node A is the high potential. Since the potential of the first node A is the high potential, the fourth switch transistor T4, the eighth switch transistor T8 and the ninth switch transistor T9 are turned off. Both the sixth switch transistor T6 and the seventh switch transistor T7 are turned on, and the second direct current signal V2 is provided to the third node C through the sixth switch transistor T6 and the seventh switch transistor T7, and thus the potential of the third node C is the low potential, and the third capacitor C3 starts to be charged. Since the potential of the third node C is the low potential, the tenth switch transistor T10 is turned on. Since the tenth switch transistor T10 is turned on and provides the first direct current signal V1 to the driving signal output terminal Output, the driving signal output terminal outputs the scanning signal with the high potential. It can be seen that the operation process of phase S34 is the same as the operation process of phase S32.

During the first half period of time of phase S35, Input=1, CK=0, CB=1. Since CK=0, the first switch transistor T1 is turned on. Since the first switch transistor T1 is turned on and provides the input signal Input to the first node A, the potential of the first node A is the high potential. Since the potential of the first node A is the high potential, the fourth switch transistor T4, the eighth switch transistor T8 and the ninth switch transistor T9 are turned off. Since CK=0, and the fifth switch transistor T5 is turned on and provides the potential of the second direct current signal V2 to second node B, and thus the potential of the second node B is the low potential. Since CB=1, the second capacitor C2 starts to be charged. Since the potential of the second node B is the low potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=1, the third switch transistor T3 and the seventh switch transistor T7 are turned off. According to the bootstrap effect of the third capacitor C3, in order to maintain the voltage difference between the two terminals of the third capacitor C3, the potential of the third node C is the low potential. Since the potential of the third node C is the low potential, the tenth switch transistor T10 is turned on. Since the tenth switch transistor T10 is turned on and provides the first direct current signal V1 to the driving signal output terminal Output, the driving signal output terminal Output outputs the scanning signal with the high potential.

During the second half period of time, Input=0, CK=1, CB=1. Since CK=1, both the first switch transistor T1 and the fifth switch transistor T5 are turned off. Since CB=1, according to the bootstrap effect of the second capacitor C2, in order to maintain the voltage difference between the two terminals of the second capacitor C2, the potential of the second node B is the low potential. Since the potential of the second node B is the low potential, both the second switch transistor T2 and the sixth switch transistor T6 are turned on. Since CB=1, both the third switch transistor T3 and the seventh switch transistor T7 are turned off. According to the bootstrap effect of the third capacitor C3, in order to maintain the voltage difference between the two terminals of the third capacitor C3, the potential of the third node C is the low potential. Since the potential of the third node C is the low potential, the tenth switch transistor T10 is turned on. Since the tenth switch transistor T10 is turned on and provides the first direct current signal V1 to the driving signal output terminal Output, the driving signal output terminal Output outputs the scanning signal with the high potential. It can be seen that the operation process of phase S35 is the same as the operation process of phase S33 in Embodiment 2. In phase S4, Input=0, CK=1, CB=0. The specific operation process is the same as the operation process of phase S4 in Embodiment 1. Thus, no further description is given herein. It can be seen that the operation process of phase S35 is the same as the operation process of phase S33 in Embodiment 2.

In phase S4, Input=0, CK=1, CB=0. The specific operation process is the same as the operation process of phase S4 in Embodiment 1. Thus, no further description is given herein.

In phase S5, during the first half period of time, Input=0, CK=0, CB=1. During the second half period of time, Input=0, CK=1, CB=1. The specific operation process is the same as the operation process of phase S5 in Embodiment 1. Thus, no further description is given herein.

After phase S5, the shift register provided in the embodiment of the present disclosure keeps repeating execution of phases S2 and S1 until the next frame starts.

It can be seen from Embodiment 1, Embodiment 2 and Embodiment 3 that, on the basis of the input signal in Embodiment 1 the shift register provided in the embodiment of the present disclosure can output the scanning signal with a corresponding time length in Embodiment 2 by prolonging one clock signal cycle of the time length of the valid pulse signal of the input signal, and can output the scanning signal with a corresponding time length in Embodiment 3 by prolonging two clock signal cycles of the time length of the valid pulse signal of the input signal, and so on and so forth. By prolonging the time length of the valid pulse signal, the scanning signal having the same time length as the valid pulse signal of the input signal could be realized.

The above shift register needs to control the time length of the scanning signal outputted by the driving signal output terminal by only changing the time length of the input signal, without changing the clock signals and changing the circuit and the manufacturing process. Therefore, compared with the technical solution of controlling the time length of the scanning signal outputted by the driving signal output terminal by using a variety of clock control signals in the prior art, the shift register of the present disclosure could reduce difficulty of the gate driving circuit and reduce process complexity, thereby reducing the cost.

Embodiment 4

Figure 4A:
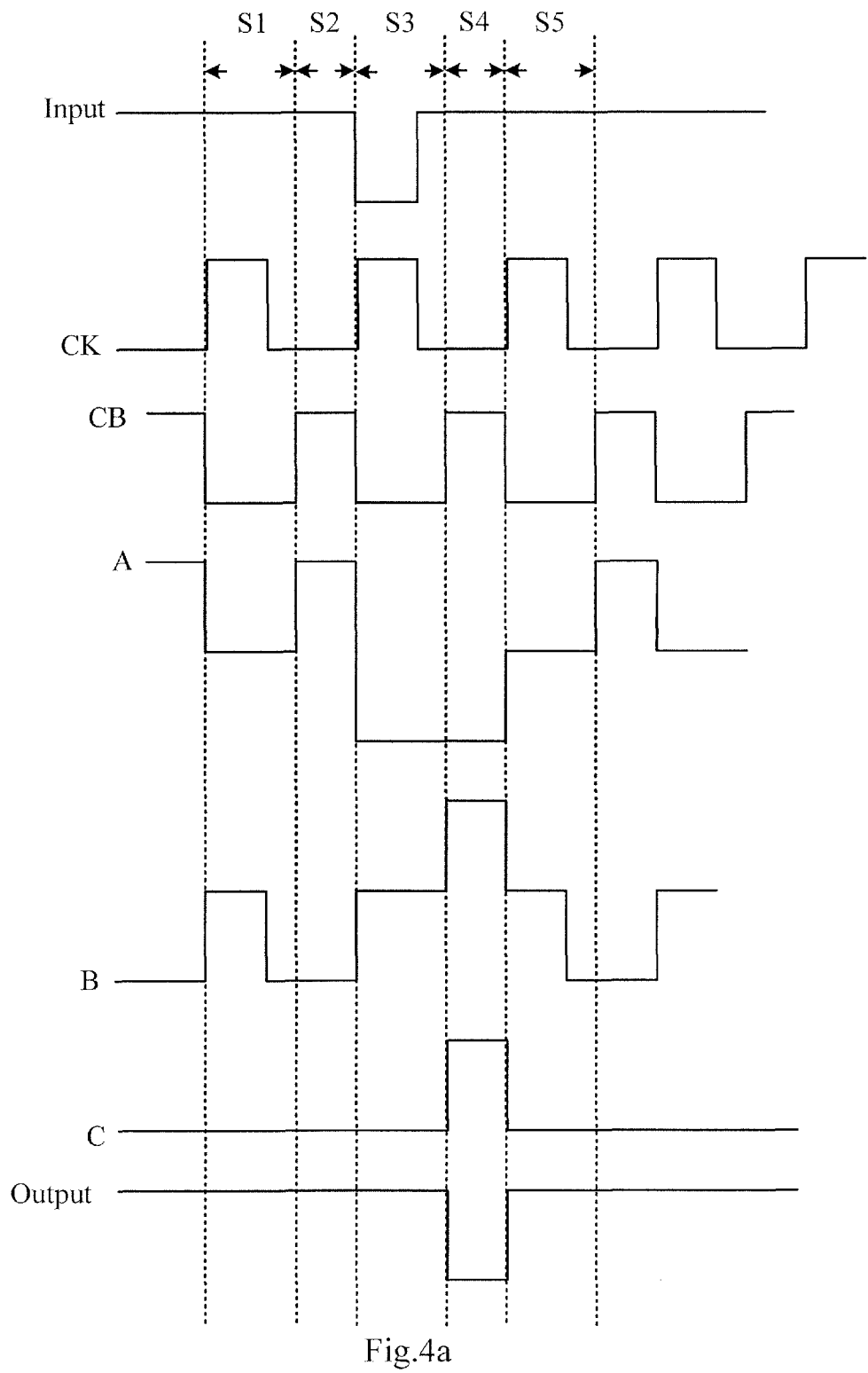
FIGS. 4a-4c are circuit timing diagrams of the shift register as shown in FIG. 2b.

The operation process of the shift register is described by taking the structure of the shift register as shown in FIG. 2b as an example. Herein, in the shift register as shown in FIG. 2b, all the switch transistors are N type transistors. The respective N type transistors are turned on under the effect of the high potential and turned off under the effect of the low potential. The first clock signal CK and the second clock signal CB have the same cycle and the same duty ratio, and the duty ratio of the first clock signal CK and the second clock signal CB is smaller than 0.5. The potential of the first direct current signal V1 is the low potential, and the potential of the second direct current signal V2 is the high potential. The corresponding input/output timing diagram is as shown in FIG. 4a. In particular, five phases S1, S2, S3, S4 and S5 in the input/output timing diagram as shown in FIG. 4a are selected.

In phase S1, during a first half period of time, Input=1, CK=1, and CB=0. Since CK=1, the first switch transistor T1 is turned on. Since the first switch transistor T1 is turned on and provides the input signal Input to the first node A, the potential of the first node A is the high potential. Since CB=0, the first capacitor C1 starts to be charged. Since the potential of the first node A is the high potential, the fourth switch transistor T4, the eighth switch transistor T8 and the ninth switch transistor T9 are turned on. Since CK=1, and the fifth switch transistor T5 is turned on and provides the potential of the second direct current signal V2 to the second node B, and thus the potential of the second node B is the high potential. Since CB=0, the second capacitor C2 starts to be charged. Since the potential of the second node B is the low potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=0, the third switch transistor T3 and the seventh transistor T7 are turned off. Since the eighth transistor T8 is turned on and provides the potential of the first direct current signal V1 to the third node C, the potential of the third node C is the low potential. Since the potential of the third node C is the low potential, the tenth switch transistor T10 is turned off. Since the ninth switch transistor T9 is turned on and provides the second direct current signal V2 to the driving signal output terminal Output, the driving signal output terminal Output outputs a scanning signal with the high potential.

During a second half period of time, Input=1, CK=0, CB=0. Since CK=0, the first switch transistor T1 and the fifth switch transistor T5 are turned off. Since CB=0, according to the bootstrap effect of the first capacitor C1, in order to maintain the voltage difference between two terminals of the first capacitor C1, the potential of the first node A maintains to the high potential of the previous period of time, so as to ensure that the fourth switch transistor T4, the eighth switch transistor T8 and the ninth switch transistor T9 are turned on in this phase. Since the fourth switch transistor T4 is turned on and provides the first clock signal CK with the low potential to the second node B, the potential of the second node B is the low potential. Since CB=0 and the potential of the second node B is the low potential, the second switch transistor T2, the third switch transistor T3, the sixth switch transistor T6 and the seventh switch transistor T7 are turned off. Since the eighth transistor T8 is turned on and provides the potential of the first direct current signal V1 to the third node C, the potential of the third node C is the low potential. Since the potential of the third node C is the low potential, the tenth switch transistor T10 is turned off. Since the ninth switch transistor T9 is turned on and provides the second direct current signal V2 to the driving signal output terminal Output, the driving signal output terminal Output outputs a scanning signal with the high potential.

In phase S2, Input=1, CK=0, CB=1. Since CK=0, the first switch transistor T1 and the fifth switch transistor T5 are turned off. Since CB=1, according to the bootstrap effect of the first capacitor C1, in order to maintain the voltage difference between two terminals of the first capacitor C1, the potential of the first node A is further pulled up, so as to ensure that the fourth switch transistor T4, the eighth switch transistor T8 and the ninth switch transistor T9 are turned on in this phase. Since the fourth switch transistor T4 is turned on, the first clock signal CK with the low potential is provided to the second node B, and thus the potential of the second node B is the low potential. Since the potential of the second node B is the low potential, both the second switch transistor T2 and the sixth switch transistor T6 are turned off. Since the eighth transistor T8 is turned on, the potential of the first direct current signal V1 is provided to the third node C, and thus the potential of the third node C is the low potential. Since the potential of the third node C is the low potential, the tenth switch transistor T10 is turned off. Since the ninth switch transistor T9 is turned on and provides the second direct current signal V2 to the driving signal output terminal Output, the driving signal output terminal Output outputs the scanning signal with the high potential.

In phase S3, during the first half period of time, Input=0, CK=1, CB=0. Since CK=1, the first switch transistor T1 is turned on. Since the first switch transistor T1 is turned on and provides the input signal Input to the first node A, the potential of the first node A is the low potential. Since the potential of the first node A is the low potential, the fourth switch transistor T4, the eighth switch transistor T8 and the ninth switch transistor T9 are turned off. Since CK=1 and the fifth switch transistor T5 is turned on and provides the potential of the second direct current signal V2 to the second node B, the potential of the second node B is the high potential. Since CB=0, the second capacitor C2 starts to be charged. Since the potential of the second node B is the high potential, both the second switch transistor T2 and the sixth switch transistor T6 are turned on, the second switch transistor T2 provides the first direct current signal V1 to the third switch transistor T3, the sixth switch transistor T6 provides the second direct current signal V2 to seventh switch transistor T7. Since CB=0, the third switch transistor T3 and the seventh switch transistor T1 are turned off. Therefore, the driving signal output terminal Output outputs the scanning signal with the high potential maintained in phase S2.

During the second half period of time, Input=1, CK=0, CB=0. Since CK=0, the first switch transistor T1 and the fifth switch transistor T5 are turned off. Since CB=0, according to the bootstrap effect of the second capacitor C2, in order to maintain the voltage difference between the two terminals of the second capacitor C2, the potential of the second node B is maintained to the high potential of the previous period of time, so as to ensure that the second switch transistor T2 and the sixth switch transistor T6 in this phase are turned on. Since CB=0, both the third switch transistor T3 and the seventh switch transistor T7 are turned off. Therefore, the driving signal output terminal Output outputs the scanning signal with the high potential maintained to the previous period of time of phase S3.

In phase S4, Input=1, CK=0, CB=1. Since CK=0, the first switch transistor T1 and the fifth switch transistor T5 are turned off. Since CB=1, according to the bootstrap effect of the second capacitor C2, in order to maintain the voltage difference between the two terminals of the second capacitor C2, the potential of the second node B is further pulled up, so as to ensure that both the second switch transistor T2 and the sixth switch transistor T6 are turned on in this phase. Since CB=1, both the third switch transistor T3 and the seventh switch transistor T7 are turned on. Since both the second switch transistor T2 and the third transistor T3 are turned on, the first clock signal CK with the low potential is provided to the first node A through the second switch transistor T2 and the third switch transistor T3, and thus the potential of the first node A is the low potential. Since the potential of the first node A is the low potential, the fourth switch transistor T4, the eighth switch transistor T8 and the ninth switch transistor T9 are turned off. Since both the sixth switch transistor T6 and the seventh transistor T7 are turned on and provide the second direct current signal V2 to the third node C through the sixth switch transistor T6 and the seventh transistor T7, the potential of the third node C is the high potential, and thus the third capacitor C3 starts to be charged. Since the potential of the third node C is the high potential, the tenth switch transistor T10 is turned on. Since the tenth switch transistor T10 is turned on and provides the first direct current signal V1 to the driving signal output terminal Output, the driving signal output terminal Output outputs the scanning signal with the low potential.

In phase S5, during the first half period of time, Input=1, CK=1, CB=0. Since CK=1, the first switch transistor T1 is turned on. Since the first switch transistor T1 is turned on and provides the input signal Input to the first node A, the potential of the first node A is the high potential. Since CB=0, the first capacitor C1 starts to be charged. Since the potential of the first node A is the high potential, the fourth switch transistor T4, the eighth switch transistor T8 and the ninth switch transistor T9 are turned on. Since CK=1, and the fifth switch transistor T5 is turned on and provides the potential of the second direct current signal V2 to the second node B, the potential of the second node B is the high potential. Since CB=0, the second capacitor C2 starts to be charged. Since the potential of the second node is the high potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=0, the third switch transistor T3 and the seventh switch transistor T7 are turned off. Since the eighth transistor T8 is turned on and provides the potential of the first direct current signal V1 to the third node C, the potential of the third node C is the low potential. Since the potential of the third node C is the low potential, the tenth switch transistor T10 is turned off. Since the ninth switch transistor T9 is turned on and provides the second direct current signal V2 to the driving signal output terminal Output, the driving signal output terminal Output outputs the scanning signal with the high potential.

During the second half period of time, Input=1, CK=0, CB=0. Since CK=0, the first switch transistor T1 and the fifth switch transistor T5 are turned off. Since CB=0, according to the bootstrap effect of the first capacitor C1, in order to maintain the voltage difference between two terminals of the first capacitor C1, the potential of the first node A maintains to the high potential of the previous period of time, so as to ensure that the fourth switch transistor T4, the eighth switch transistor T8 and the ninth switch transistor T9 are turned on in this phase. Since the fourth switch transistor T4 is turned on, the first clock signal CK with the low potential is provided to the second node B, and thus the potential of the second node B is the low potential. Since CB=0 and the potential of the second node B is the low potential, the second switch transistor T2, the third switch transistor T3, the sixth switch transistor T6 and the seventh switch transistor T7 are turned off. Since the eighth switch transistor T8 is turned on and provides the potential of the first direct current signal V1 to the third node C, the potential of the third node C is the low potential. Since the potential of the third node C is the low potential, the tenth switch transistor T10 is turned off. Since the ninth switch transistor T9 is turned on and provides the second direct current signal V2 to the driving signal output terminal Output, the driving signal output terminal Output outputs the scanning signal with the high potential.

After the phase S5, the shift register provided in the embodiment of the present disclosure keeps repeating execution of phases S2 and S1 until the next frame starts.

Embodiment 5

Figure 4B:
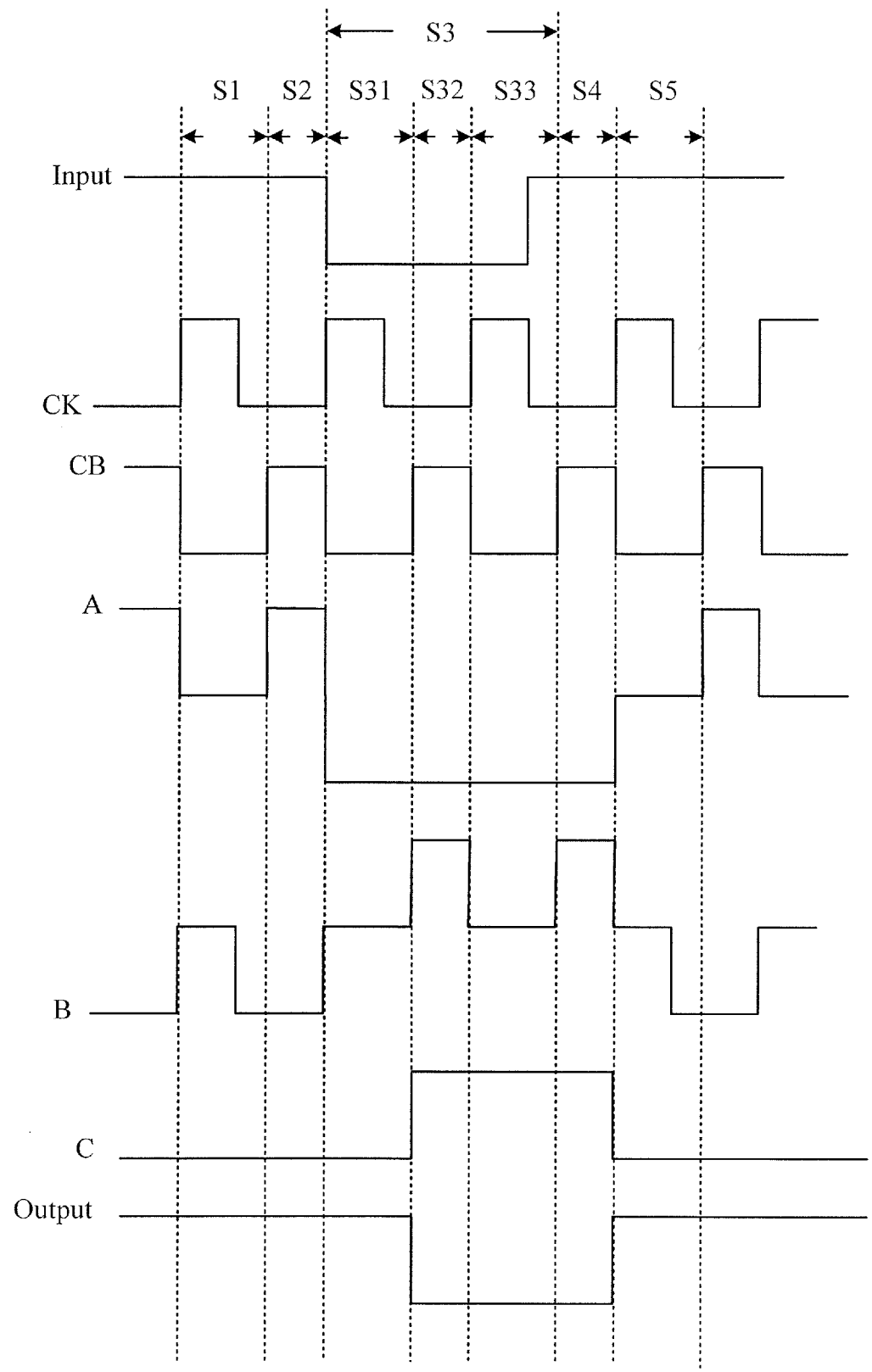

The operation process of the shift register is described by taking the structure of the shift register as shown in FIG. 2b as an example. On the basis of Embodiment 4, the time length of the valid pulse signal of the input signal Input is prolonged one clock signal cycle, and its corresponding input/output timing diagram is as shown in FIG. 4b. In particular, five phases S1, S2, S3, S4, and S5 in the input/output timing diagram as shown in FIG. 4b are selected, wherein phase S3 is divided into three phases S31, S32, and S33.

In phase S1, during the first half period of time, Input=1, CK=1, CB=0. During the second half period of time, Input=1, CK=0, CB=0. The specific operation process is the same as the operation process in phase S1 in embodiment 1. Thus, no further description is given herein.

In phase S2, Input=1, CK=0, CB=1. The specific operation process is the same as the operation process in phase S2 in Embodiment 4. Thus, no further description is given herein.

In phase S3, during the first half period of time in phase S31, Input=0, CK=1, CB=0. Since CK=1, the first switch transistor T1 is turned on. Since the first switch transistor T1 is turned on and provides the input signal Input to the first node A, the potential of the first node A is the low potential.

Since the potential of the first node A is the low potential, the fourth switch transistor T4, the eighth switch transistor T8 and the ninth switch transistor T9 are turned off. Since CK=1 and the fifth switch transistor T5 is turned on and provides the potential of the second direct current signal V2 to the second node B, the potential of the second node B is the high potential. Since CB=0, the second capacitor C2 starts to be charged. Since the potential of the second node B is the high potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=0, the third switch transistor T3 and the seventh switch transistor T7 are turned off. Therefore, the driving signal output terminal Output outputs the scanning signal with the high potential maintained in phase S2.

During the second half period of time, Input=0, CK=0, CB=0. Since CK=0, both the first switch transistor T1 and the fifth switch transistor T5 are turned off. Since CB=0, according to the bootstrap effect of the first capacitor C1, in order to maintain the voltage difference between the two terminals of the first capacitor C1, the potential of the first node A is still the low potential, so as to ensure that the fourth switch transistor T4, the eighth switch transistor T8 and the ninth switch transistor T9 are turned off in this phase. Since CB=0, according to the bootstrap effect of the second capacitor C2, in order to maintain the voltage difference between the two terminals of the second capacitor C2. The potential of the second node B is still the high potential, so as to ensure that both the second switch transistor T2 and the sixth switch transistor T6 are turned on in this phase. Since CB=0, both the third switch transistor T3 and the seventh switch transistor T7 are turned off. Therefore, the driving signal output terminal Output outputs the scanning signal with the high potential maintained to the previous period of time of phase S3.

In phase S32, Input=0, CK=0, CB=1. Since CK=0, both the first switch transistor T1 and the fifth switch transistor T5 are turned off. Since CB=1, according to the bootstrap effect of the second capacitor C2, in order to maintain the voltage difference between the two terminal of the second capacitor C2, the potential of the second node B is further pulled up, so as to ensure that both the second switch transistor T2 and the sixth switch transistor T6 are turned on in this phase. Since CB=1, both the third transistor T3 and the seventh transistor T7 are turned on. Since both the second switch transistor T2 and the third transistor T3 are turned on, the first clock signal CK with the low potential is provided to the first node A through the second switch transistor T2 and the third switch transistor T3, and thus the potential of the first node A is the low potential. Since the potential of the first node A is the low potential, the fourth switch transistor T4, the eighth switch transistor T8 and the ninth switch transistor T9 are turned off. Since the sixth switch transistor T6 and the seventh switch transistor T7 are turned on and the second direct current signal V2 is provided to the third node C through the sixth switch transistor T6 and the seventh switch transistor T7, the potential of the third node C is the high potential, and the third capacitor C3 starts to be charged. Since the potential of the third node C is the high potential, the tenth switch transistor T10 is turned on. Since the tenth switch transistor T10 is turned on and provides the first direct current signal V1 to the driving signal output terminal Output, the driving signal output terminal Output outputs the scanning signal with the low potential.

During the first half period of time of phase S33, Input=0, CK=1, CB=0. Since CK=1, the first switch transistor T1 is turned on. Since the first switch transistor T1 is turned on and provides the input signal Input to the first node A, the potential of the first node A is the low potential. Since the potential of the first node A is the low potential, the fourth switch transistor T4, the eighth switch transistor T8 and the ninth switch transistor T9 are turned off. Since CK=0, the fifth switch transistor T5 is turned on and provides the potential of the second direct current signal V2 to the second node B, the potential of the second node B is the high potential. Since CB=0, the second capacitor C2 starts to be charged. Since the potential of the second potential B is the high potential, both second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=0, the third switch transistor T3 and the seventh switch transistor T7 are turned off. According to the bootstrap effect of the third capacitor C3, in order to maintain the voltage difference between the two terminals of the third capacitor C3, the potential of the third node C is the high potential. Since the potential of the third node C is the high potential, the tenth switch transistor T10 is turned on. Since the tenth switch transistor T10 is turned on and provides the first direct current signal V1 to the driving signal output terminal Output, the driving signal output terminal Output outputs the scanning signal with the low potential.

During the second half period of time, Input=1, CK=0, CB=0. Since CK=0, both the first switch transistor T1 and the fifth switch transistor T5 are turned off. Since CB=0, according to the bootstrap effect of the second capacitor C2, in order to maintain the voltage different between the two terminals of the second capacitor C2, the potential of the second node B is the high potential. Since the potential of the second node B is the high potential, both the second switch transistor T2 and the sixth switch transistor T6 are turned on. Since CB=0, both the third switch transistor T3 and the seventh switch transistor T7 are turned off. According to the bootstrap effect of the third capacitor C3, in order to maintain the voltage difference between the two terminals of the third capacitor C3, the potential of the third node C is the high potential. Since the potential of the third node C is the high potential, the tenth switch transistor T10 is turned on. Since the tenth switch transistor T10 is turned on and provides the first direct current signal V1 to the driving signal output terminal Output, the driving signal output terminal Output outputs the scanning signal with the low potential.

In phase S4, Input=1, CK=0, CB=1. The specific operation process is the same as the operation process in phase S4 in Embodiment 4. Thus, no further description is given herein.

In phase S5, during the first half period of time, Input=1, CK=1, CB=0. During the second half period of time, Input=1, CK=0, CB=0. The specific operation process is the same as the operation process in phase S5 in Embodiment 4. Thus, no further description is given herein.

After the phase S5, the shift register provided in the embodiment of the present disclosure keeps repeating execution of phases S2 and S1 until the next frame starts.

Embodiment 6

Figure 4C:
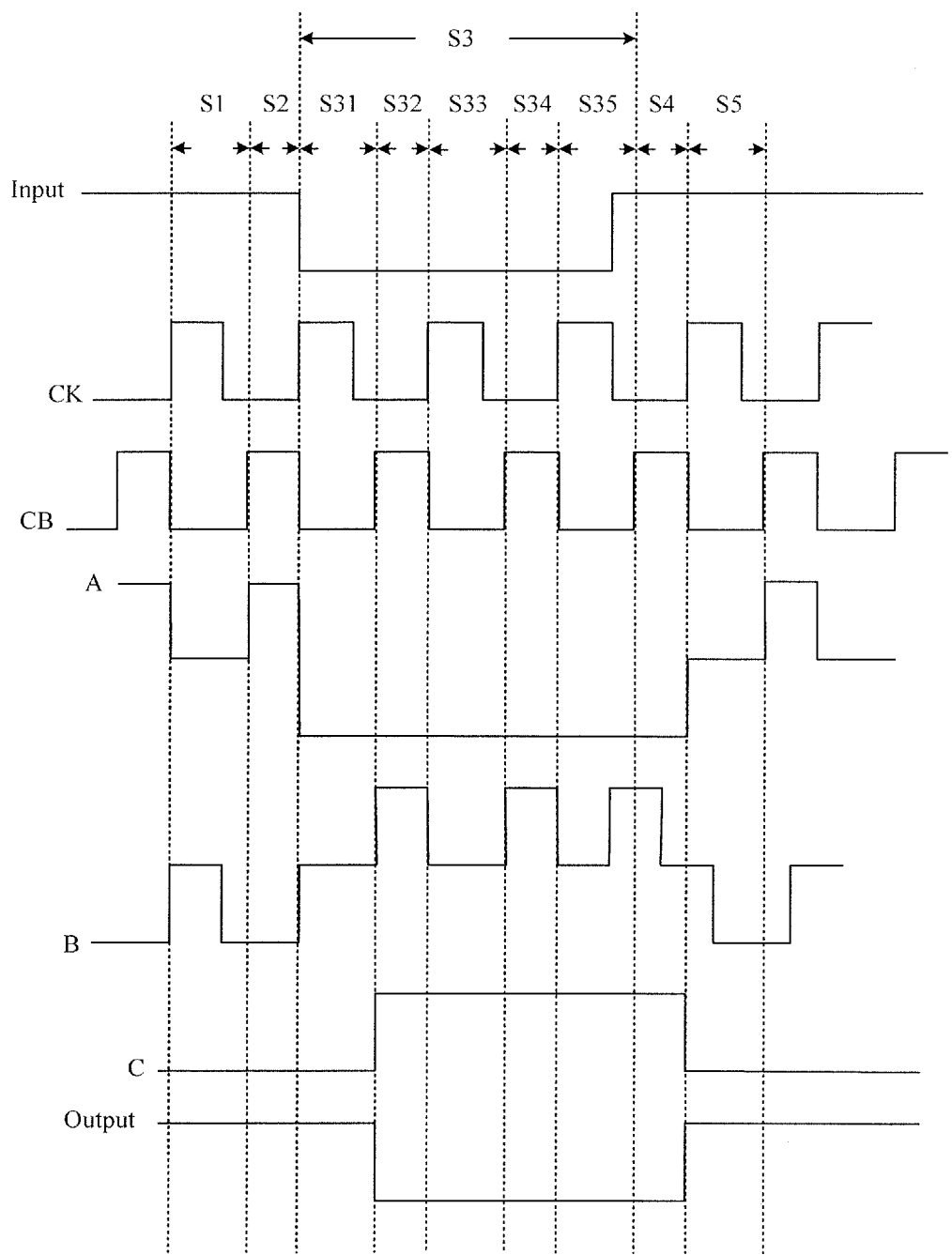

The operation process of the shift register is described by taking the structure of the shift register as shown in FIG. 2b as an example. On the basis of Embodiment 4, the time length of the valid pulse signal of the input signal Input is prolonged one clock signal cycle, and its corresponding input/output timing diagram is as shown in FIG. 4c. In particular, five phases S1, S2, S3, S4, and S5 in the input/output timing diagram as shown in FIG. 4c are selected, wherein phase S3 is divided into is divided into five phases S31, S32, S33, S34, and S35.

In phase S1, during the first half period of time, Input=1, CK=1, CB=0. During the second half period of time, Input=1, CK=0, CB=0. The specific operation process is the same as the operation process in phase S1 in Embodiment 4. Thus, no further description is given herein.

In phase S2, Input=1, CK=0, CB=1. The specific operation process is the same as the operation process in phase S2 in Embodiment 4. Thus, no further description is given herein.

In phase S3, during the first half period of time of phase S31, Input=0, CK=1, CB=0. During the second half period time of phase S31, Input=0, CK=0, CB=0. The specific operation process is the same as the operation process in phase S31 in Embodiment 4. Thus, no further description is given herein.

In phase S32, Input=0, CK=0, CB=1. The specific operation process is the same as the operation process in phase S32 in Embodiment 4. Thus, no further description is given herein.

In phase S33, during the first half period of time, Input=0, CK=1, CB=0. Since CK=1, the first switch transistor T1 is turned on. Since the first switch transistor T1 is turned on and provides the input signal Input to the first node A, the potential of the first node A is the low potential. Since the potential of the first node A is the low potential, the fourth switch transistor T4, the eighth switch transistor T8 and the ninth switch transistor T9 are turned off. Since CK=1, and the fifth switch transistor T5 is turned on and provides the potential of the second direct current signal V2 to the second node B, the potential of the second node B is the high potential. Since CB=0, the second capacitor C2 starts to be charged. Since the potential of the second node B is the high potential, both the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=0, the third switch transistor T3 and the seventh switch transistor T7 are turned off. Therefore, the driving signal output terminal Output outputs the scanning signal with the high potential maintained in phase S2. It can be seen that the operation process of phase S33 is the same as the operation process of phase S31.

During the second half period of time, Input=0, CK=0, CB=0. Since CK=0, both the first switch transistor T1 and the fifth switch transistor T5 are turned off. Since CB=0, according to the bootstrap effect of the first capacitor C1, in order to maintain the voltage difference between the two terminals of the first capacitor C1, the potential of the first node A is still the low potential, so as to ensure that the fourth switch transistor T4, the eighth switch transistor T8 and the ninth switch transistor T9 are turned off in this phase. Since CB=0, according to the bootstrap effect of the second capacitor C2, in order to maintain the voltage difference between the two terminals of the second capacitor C2, the potential of the second node B is still the high potential, so as to ensure that both the second switch transistor T2 and the sixth switch transistor T6 are turned on in this phase. Since CB=0, both third switch transistor T3 and the seventh switch transistor T7 are turned off. Therefore, the driving signal output terminal Output outputs the scanning signal with the high potential maintained to the previous period of time of phase S3. It can be seen that the operation process of phase S33 is the same as the operation process of phase S31.

In phase S34, Input=0, CK=0, CB=1. Since CK=0, both the first switch transistor T1 and the fifth switch transistor T5 are turned off. Since CB=1, according to the bootstrap effect of the second capacitor C2, in order to maintain the voltage difference between the two terminals of the second capacitor, the potential of the second node B is further pulled up, so as to ensure that both the second switch transistor T2 and the six switch transistor T6 are turned on in this phase. Since CB=0, both the third transistor T3 and the seventh switch transistor T7 are turned on. Since both the second switch transistor T2 and the third switch transistor T3 are turned on, the first clock signal CK with the low potential is provided to the first node A through the second switch transistor T2 and the third switch transistor T3, and thus the potential of the first node A is the low potential. Since the potential of the first node A is the low potential, the fourth switch transistor T4, the eighth switch transistor T8 and the ninth switch transistor T9 are turned off. Since the sixth switch transistor 16 and the seventh switch transistor T7 are turned on, and the second direct current signal V2 is provided to the third node C through the sixth switch transistor T6 and the seventh switch transistor T7, the potential of the third node C is the high potential, and thus the third capacitor C3 starts to be charged. Since the potential of the third node C is the high potential, the tenth switch transistor T10 is turned on. Since the tenth switch transistor T10 is turned on and provides the first direct current signal V1 to the driving signal output terminal Output, the driving signal output terminal outputs the scanning signal with the low potential. It can be seen that the operation process of phase S33 is the same as the operation process of phase S32. It can be seen that the operation process of phase S34 is the same as the operation process of phase S32.

During the first half period of time of phase S35, Input=0, CK=1, CB=0. Since CK=1, the first switch transistor T1 is turned on. Since the first switch transistor T1 is turned on and provides the input signal Input to the first node A, the potential of the first node A is the low potential. Since the potential of the first node A is the low potential, the fourth switch transistor T4, the eighth switch transistor T8 and the ninth switch transistor T9 are turned off. Since CB=0, and the fifth switch transistor T5 is turned on and provides the potential of the second direct current signal V2 to second node B, the potential of the second node B is the high potential. Since CB=0, the second capacitor C2 starts to be charged. Since the potential of the second node B is the high potential, the second switch transistor T2 and the sixth switch transistor T6 are turned on, the second switch transistor T2 provides the first direct current signal V1 to the third switch transistor T3, and the sixth switch transistor T6 provides the second direct current signal V2 to the seventh switch transistor T7. Since CB=0, the third switch transistor T3 and the seventh switch transistor T7 are turned off. According to the bootstrap effect of the third capacitor C3, in order to maintain the voltage difference between the two terminals of the third capacitor C3, the potential of the third node C is the high potential. Since the potential of the third node C is the high potential, the tenth switch transistor T10 is turned on. Since the tenth switch transistor T10 is turned on and provides the first direct current signal V1 to the driving signal output terminal Output, the driving signal output terminal Output outputs the scanning signal with the low potential.

During the second half period of time, Input=1, CK=0, CB=0. Since CK=0, the first switch transistor T1 and the fifth switch transistor T5 are turned off. Since CB=0, according to the bootstrap effect of the second capacitor C2, in order to maintain the voltage difference between the two terminals of the second capacitor C2, the potential of the second node B is the high potential. Since the potential of the second node B is the high potential, the second switch transistor T2 and the sixth switch transistor T6 are turned on. Since CB=0, the third switch transistor T3 and the seventh switch transistor T7 are turned off. According to the bootstrap effect of the third capacitor C3, in order to maintain the voltage difference between the two terminals of the third capacitor C3, the potential of the third node C is the high potential. Since the potential of the third node C is the high potential, the tenth switch transistor T10 is turned on. Since the tenth switch transistor T10 is turned on and provides the first direct current signal V1 to the driving signal output terminal Output, the driving signal output terminal Output outputs the scanning signal with the low potential. It can be seen that the operation process of phase S35 is the same as the operation process of phase S33 in Embodiment 5.

In phase S4, Input=1, CK=0, CB=1. The specific operation process is the same as the operation process of phase S4 in Embodiment 4. Thus, no further description is given herein.

In phase S5, during the first half period of time, Input=1, CK=1, CB=0. During the second half period of time, input=1, CK=10, CB=0. The specific operation process is the same as the operation process of phase S5 in Embodiment 4. Thus, no further description is given herein.

After phase S5, the shift register provided in the embodiment of the present disclosure keeps repeating execution of phases S2 and S1 until the next frame starts.

It can be seen from Embodiment 4, Embodiment 5 and Embodiment 6 that, on the basis of the input signal in Embodiment 4, the shift register provided in the embodiment of the present disclosure can output the scanning signal with a corresponding time length in Embodiment 5 by prolonging one clock signal cycle of the time length of the valid pulse signal of the input signal, and can output the scanning signal with a corresponding time length in Embodiment 6 by prolonging two clock signal cycles of the time length of the valid pulse signal of the input signal, and so forth. By prolonging the time length of the valid pulse signal, the scanning signal having the same time length as the valid pulse signal of the input signal can be realized.

The above shift registers need to control the time length of the scanning signal outputted by the driving signal output terminal by just changing the time length of the input signal, without changing the clock signal and changing the circuit and the manufacturing process. Therefore, compared with controlling the time length of the scanning signal outputted by the driving signal output terminal by using a variety of clock control signals in the prior art, the shift registers in the present disclosure could reduce difficulty of the gate driving circuit and reduce process complexity, thereby reducing the cost.

Figure 5:
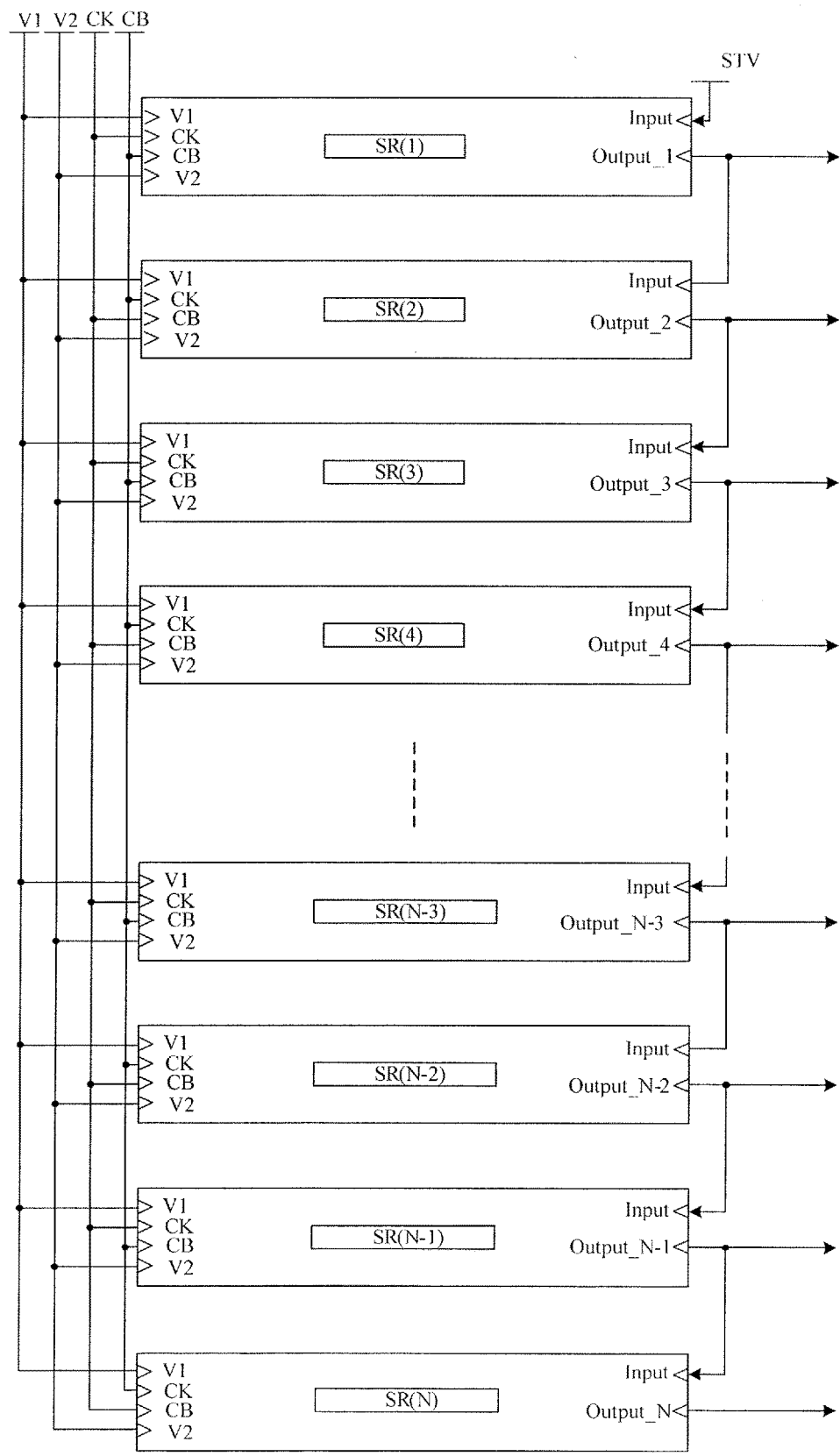
FIG. 5 is a schematic diagram of a structure of a gate driving circuit provided in an embodiment of the present disclosure.

Based on the same inventive concept, there is further provided in an embodiment of the present disclosure a gate driving circuit as shown in FIG. 5, comprising multiple shift registers connected in series: SR(1), SR(2) ... SR(n) ... SR(N-1), SR(N) (totally N shift registers, 1≤n≤N), wherein an input signal Input of a first stage of shift register SR(1) is inputted by a start signal terminal STV. Except for the first stage of shift register SR(1), input signals Input of remaining respective stages of shift registers SR(n) are inputted by a driving signal output terminal Output_n-1 of a previous stage of shift register SR(n-1) connected thereto.

Further, in the gate driving circuit provided in the embodiment of the present disclosure, a first clock signal CK, a second clock signal CB, a first direct current signal V1 and a second direct current signal V2 are inputted into the respective stages of shift registers.

In particular, a specific structure of each shift register in the gate driving circuit has the same function and structure as the above shift register in the embodiments of the present disclosure, and thus no further description is given herein. The gate driving circuit could be applied to a liquid crystal display panel LCD, or could be applied to an organic light-emitting display panel, to which no further limitation is made.

It is well known that in the existing OLED display panel, the scanning time length of the gate driving circuit adopted is fixed, and pixels of respective rows in the display panel are in a light-emitting state after scanning starts, thereby resulting in that it is not easy to adjust the light-emitting time of pixels of respective rows in the display panel.

The gate driving circuit provided in the present disclosure needs to control the time length of the scanning signal outputted by the driving signal output terminal by just changing the time length of the input signal. Therefore, application of the gate driving circuit provided in the embodiments of the present disclosure into the OLED display panel can control the time length of the scanning signal by changing the time length of the input signal, so that the light-emitting time of pixels of respective rows is controlled by controlling the scanning time, and thus the light-emitting luminance of the OLED display panel could be controlled.

Based on the same inventive concept, there is further provided in an embodiment of the present disclosure an organic light-emitting display panel, comprising the gate driving circuit described above. Scanning signals are provided for respective gate lines on the array substrate in the organic light-emitting display panel through the this gate driving circuit, please referring to the above description above the gate driving circuit for the specific implementation, and thus no further description is given herein.

Based on the same inventive concept, there is further provided in an embodiment of the p resent disclosure a display device, comprising the organic light-emitting display panel provided in the embodiment of the present disclosure.

The shift register, the gate driving circuit and the relevant display device provided in the embodiments of the present disclosure comprise: the first node controlling module, the second node controlling module, the third node controlling module, the first outputting module, and the second outputting module, wherein the first node controlling module adjusts the potential of the first node through the input signal, the first clock signal, the second clock signal, the first direct current signal and the potential of the second node, the second node controlling module adjusts the potential of the second node through the first clock signal, the second clock signal, the first direct current signal, the second direct current signal and the potential of the first node, the third node controlling module adjusts the potential of the third node through the second clock signal, the second direct current signal, the potential of the first node and the potential of the second node, the first outputting module adjusts the potential of the driving signal output terminal through the second direct current signal and the potential of the first node, and the second outputting module adjusts the potential of the driving signal output terminal though the first direct current signal and the potential of the third node. Through mutual coordination of the above five modules, the shift register could control the time length of the scanning signal outputted by the driving signal output terminal by only changing the time length of the input signal, without changing the clock signal, changing the circuit and changing the process. Therefore, compared with the prior art where the time length of the scanning signal outputted by the driving signal output terminal is controlled by using various clock control signals, the present disclosure could reduce difficulty of the gate driving circuit and solve problem of process complexity, so as to reduce cost.

Obviously, those skilled in the art could make various alternations and modifications to the present disclosure without departing from the spirit and scope of the present disclosure. As such, if these alterations and modifications of the present disclosure fall into the scope of the claims of the present disclosure as well as the equivalent technique thereof, then the present disclosure also intends to include these alternations and medications.

The present application claims the priority of a Chinese patent application No. 201510536801.4 filed on Aug. 27, 2015. Herein, the content disclosed by the Chinese patent application is incorporated in full by reference as a part of the present disclosure.

What is claimed is:

1. A shift register, comprising: a first node controlling module, whose first input terminal is used to receive an input signal, second input terminal is used to receive a first clock signal, third input terminal is used to receive a second clock signal, fourth input terminal is used to receive a first direct current signal, fifth input terminal is connected to a second node, and output terminal is connected to a first node, and configured to provide the input signal to the first node when a potential of the first clock signal is a first potential, provide the first direct current signal to the first node when both a potential of the second clock signal and a potential of the second node are the first potential, and maintain a voltage difference between the third input terminal and the first node to a voltage difference of a previous period of time when the first node is in a floating status;
   a second node controlling module, whose first input terminal of is used to receive a second direct current signal, second input terminal is used to receive the first clock signal, third input terminal is used to receive a second clock signal, fourth input terminal is connected to the first node, and output terminal is connected to the second node, and configured to provide the second direct current signal to the second node when a potential of the first clock signal is the first potential, provide the first clock signal to the second node when a potential of the first node is the first potential, and maintain a voltage difference between the third input terminal and the second node to the voltage difference of the previous period of time when the second node is in a floating status;
   a third node controlling module, whose first input terminal is used to receive the second clock signal, second input terminal is used to receive the first direct current signal, third input terminal is used to receive the second direct current signal, fourth input terminal is connected to the first node, fifth input terminal is connected to the second node, and output terminal is connected to the third node, and configured to provide the first direct current signal to the third node when the potential of the first node is the first potential, provide the second direct current signal to the third node when both the potential of the second clock signal and the potential of the second node are the first potential, and maintain a voltage difference between the second input terminal and the third node to the voltage difference of the previous period of time when the third node is in a floating status;
   a first outputting module, whose first input terminal is used to receive the second direct current signal, second input terminal is connected to the first node, and output terminal is connected to a driving signal output terminal of the shift register, and configured to provide the second direct current signal to the driving signal output terminal when the potential of the first node is the first potential;
   a second output module, whose first input terminal is used to receive the first direct current signal, second input terminal is connected to the third node, and output terminal is connected to the driving signal output terminal, and configured to provide the first direct current signal to the driving signal output terminal when the potential of the third node is the first potential.

2. The shift register according to claim 1, wherein the first node controlling module comprises; a first switch transistor, a second switch transistor, a third switch transistor, and a first capacitor;
   a gate of the first switch transistor is used to receive the first clock signal, a source thereof is used to receive the input signal, and a drain thereof is connected to the first node;
   a gate of the second switch transistor is connected to the second node, a source thereof is used to receive the first direct current signal, and a drain thereof is connected to a source of the third switch transistor;
   a gate of the third switch transistor is used to receive the second clock signal, and a drain thereof is connected to the first node; and
   one terminal of the first capacitor is connected to the first node, and the other terminal thereof is used to receive the second clock signal.

3. The shift register according to claim 2, wherein when the valid pulse signal of the input signal is a high potential, all of switch transistors are P type transistors; when a valid pulse signal of the input signal is a low potential, all of switch transistors are N type transistors.

4. The shift register according to claim 3, wherein when the valid pulse signal of the input signal is a high potential, a rising edge of the input signal aligns with a falling edge of the first clock signal and a rising edge of the second clock signal, and a falling edge of the input signal aligns with a rising edge of the first clock signal; the first clock signal and the second clock signal have a same cycle and a same duty ratio, and the duty ratio is greater than 0.5; or
   when the valid pulse signal of the input signal is a low potential, the falling edge of the input signal aligns with the rising edge of the first clock signal and the falling edge of the second clock signal, and the rising edge of the input signal aligns with the falling edge of the first clock signal; the first clock signal and the second clock signal have a same cycle and a same duty ratio, and the duty ratio is smaller than 0.5.

5. The shift register according to claim 1, wherein the second node controlling module comprises: a fourth switch transistor, a fifth switch transistor and a second capacitor;

a gate of the fourth switch transistor is connected to the first node, a source thereof is used to receive the first clock signal, and a drain thereof is connected to the second node;

a gate of the fifth switch transistor is used to receive the first clock signal, a source thereof is used to receive the second direct current signal, and a drain thereof is connected to the second node; and one terminal of the second capacitor is connected to the second node, and the other terminal thereof is used to receive the second clock signal.

6. The shift register according to claim 1, wherein the third node controlling module comprises: a sixth switch transistor, a seventh switch transistor, an eighth switch transistor and a third capacitor;

a gate of the sixth switch transistor is connected to the second node, a source thereof is used to receive the second direct current signal, and a drain thereof is connected to a source of the seventh switch transistor;

a gate of the seventh switch transistor is used to receive the second clock signal; and a drain thereof is connected to the third node;

a gate of the eighth switch transistor is connected to the first node, a source thereof is used to receive the first direct current signal, and a drain thereof is connected to the third node; and one terminal of the third capacitor is connected to the third node, and the other terminal thereof is used to receive the first direct current signal.

7. The shift register according to claim 1, wherein the first outputting module comprises: a ninth switch transistor;

a gate of the ninth switch transistor is connected to the first node, a source thereof is used to receive the second direct current signal, and a drain thereof is connected to the driving signal output terminal.

8. The shift register according to claim 1, wherein the second outputting module comprises: a tenth switch transistor;

a gate of the tenth switch transistor is connected to the third node, a source thereof is used to receive the first direct current signal, and a drain thereof is connected to the driving signal output terminal.

9. The shift register according to claim 1, wherein when a valid pulse signal of the input signal is a high potential, the first potential is a low potential, and when a potential of the first direct current signal is a high potential, a potential of the second direct current signal is a low potential; or when the valid pulse signal of the input signal is a low potential, the first potential is a high potential, and when a potential of the first direct current signal is a low potential, a potential of the second direct current signal is a high potential.

10. A gate driving circuit, comprising multiple shift registers connected in series according to claim 1, wherein an input signal of a first stage of shift register is inputted from a start signal terminal;

except for the first stage of shift register, input signals of remaining stages of shift registers are inputted from a driving signal output terminal of a previous stage of shift register connected thereto.

11. An organic light-emitting display panel, comprising the gate driving circuit according to claim 10.

12. A display device comprising the organic light-emitting display panel according to claim 11.

13. The gate driving circuit according to claim 10, wherein the first node controlling module comprises: a first switch transistor, a second switch transistor, a third switch transistor, and a first capacitor;

a gate of the first switch transistor is used to receive the first clock signal, a source thereof is used to receive the input signal, and a drain thereof is connected to the first node;

a gate of the second switch transistor is connected to the second node, a source thereof is used to receive the first direct current signal, and a drain thereof is connected to a source of the third switch transistor;

a gate of the third switch transistor is used to receive the second clock signal, and a drain thereof is connected to the first node; and one terminal of the first capacitor is connected to the first node, and the other terminal thereof is used to receive the second clock signal.

14. The gate driving circuit according to claim 13, wherein when the valid pulse signal of the input signal is a high potential, all of switch transistors are P type transistors; when a valid pulse signal of the input signal is a low potential, all of switch transistors are N type transistors.

15. The gate driving circuit according to claim 10, wherein the second node controlling module comprises: a fourth switch transistor, a fifth switch transistor and a second capacitor;

a gate of the fourth switch transistor is connected to the first node, a source thereof is used to receive the first clock signal, and a drain thereof is connected to the second node;

a gate of the fifth switch transistor is used to receive the first clock signal, a source thereof is used to receive the second direct current signal, and a drain thereof is connected to the second node; and one terminal of the second capacitor is connected to the second node, and the other terminal thereof is used to receive the second clock signal.

16. The gate driving circuit according to claim 10, wherein the third node controlling module comprises: a sixth switch transistor, a seventh switch transistor, an eighth switch transistor and a third capacitor;

a gate of the sixth switch transistor is connected to the second node, a source thereof is used to receive the second direct current signal, and a drain thereof is connected to a source of the seventh switch transistor;

a gate of the seventh switch transistor is used to receive the second clock signal; and a drain thereof is connected to the third node;

a gate of the eighth switch transistor is connected to the first node, a source thereof is used to receive the first direct current signal, and a drain thereof is connected to the third node; and one terminal of the third capacitor is connected to the third node, and the other terminal thereof is used to receive the first direct current signal.

17. The gate driving circuit according to claim 10, wherein the first outputting module comprises: a ninth switch transistor;

a gate of the ninth switch transistor is connected to the first node, a source thereof is used to receive the second direct current signal, and a drain thereof is connected to the driving signal output terminal.

18. The gate driving circuit according to claim 10, wherein the second outputting module comprises: a tenth switch transistor;

a gate of the tenth switch transistor is connected to the third node, a source thereof is used to receive the first direct current signal, and a drain thereof is connected to the driving signal output terminal.

19. The gate driving circuit according to claim 10, wherein when a valid pulse signal of the input signal is a high potential, the first potential is a low potential, and when a potential of the first direct current signal is a high potential, a potential of the second direct current signal is a low potential; or when the valid pulse signal of the input signal is a low potential, the first potential is a high potential, and when a potential of the first direct current signal is a low potential, a potential of the second direct current signal is a high potential.

* * * * *